(12) United States Patent
Sato

(10) Patent No.: US 8,106,679 B2
(45) Date of Patent: Jan. 31, 2012

(54) DATA PROCESSING SYSTEM

(75) Inventor: Tomoyoshi Sato, Ibaraki (JP)

(73) Assignee: Fuji Xerox Co., Ltd., Minato-ku, Tokyo (JP)

(*) Notice: Subject to any disclaimer, the term of this patent is extended or adjusted under 35 U.S.C. 154(b) by 805 days.

(21) Appl. No.: 10/568,666

(22) PCT Filed: Aug. 27, 2004

(86) PCT No.: PCT/JP2004/012380
§ 371 (c)(1),
(2), (4) Date: Jan. 21, 2008

(87) PCT Pub. No.: WO2005/022380
PCT Pub. Date: Mar. 10, 2005

(65) Prior Publication Data
US 2008/0122482 A1    May 29, 2008

(30) Foreign Application Priority Data
Aug. 29, 2003    (JP) .................................. 2003-306357

(51) Int. Cl.
*G06F 1/00* (2006.01)
(52) U.S. Cl. ........................................................ 326/38
(58) Field of Classification Search .................... 326/38
See application file for complete search history.

(56) References Cited

U.S. PATENT DOCUMENTS

| | | | |
|---|---|---|---|
| 6,091,258 A * | 7/2000 | McClintock et al. ............ | 326/10 |
| 6,212,591 B1 * | 4/2001 | Kaplinsky ..................... | 710/305 |
| 6,507,214 B1 * | 1/2003 | Snyder ............................ | 326/38 |

OTHER PUBLICATIONS

European Search Report for EP 04 77 2336 dated Nov. 11, 2008.
Bondalapati et al., "Reconfigurable Computing Systems," *Proceedings of the IEEE*, 90:1201-1208 (2002).
Borgatti et al., "A Reconfigurable System Featuring Dynamically Extensible Embedded Microprocessor, FPGA, and Customizable I/O," *J. of Solid-State Circuits*, 38:521-529 (2003).
Hauck et al., "Reconfigurable Computing: A Survey of Systems and Software," *ACM Computing Surveys*, 34:171-210 (2002).
Hauck, "The Roles of FPGA's in Reprogrammable Systems," *Proceedings of the IEEE*, 86:615-638 (1998).
Meribout, "A New Scalable and Reconfigurable Architecture," *IEEE Potentials*, 22:26-32 (2003).
Sugawara et al., "Dynamically Reconfigurable Processor Implemented with IPFlex's DAPDNA Technology," *IEICE Trans. Inf. & Syst*, E87-D: 1997-2003 (2004).
International Preliminary Report on Patentability for PCT/JP2004/012380 dated May 15, 2006.
Written Opinion for PCT/JP2004/012380 dated May 15, 2006.

* cited by examiner

*Primary Examiner* — William M Treat
(74) *Attorney, Agent, or Firm* — Marshall, Gerstein & Borun LLP

(57) ABSTRACT

The present invention provides an architecture code 20 including object circuit information 23 for mapping an object circuit that is at least part of a circuit for executing an application onto part of a logic circuit where circuits can be dynamically reconfigured, interface circuit information 24 for mapping an interface circuit in contact with the object circuit onto the logic circuit, and boundary condition 26 to be realized in the interface circuit. A data processing system in the present invention includes a load unit obtaining an architecture code 20, a mapping unit for mapping the object circuit and the interface circuit in contact with the object circuit onto the logic circuit region according to the object circuit information 23 and the interface circuit information 24 of the architecture code, and a behavior control unit for controlling the interface circuit according to the boundary condition 26 of the architecture code.

24 Claims, 12 Drawing Sheets

Fig. 14

| cfg-mod [2:0] | idat [3] | [2] | [1] | [0] | odat_g [1] | [0] | odat_r | comments |
|---|---|---|---|---|---|---|---|---|
| 000 (4in1out) [MODE 0] | 0 | 0 | 0 | 0 | 0 | cfg_func [0] | cfg-func [0] | Hold value of odat-g[0] |
| | 0 | 0 | 0 | 1 | 0 | cfg_func [1] | cfg-func [1] | |
| | 0 | 0 | 1 | 0 | 0 | cfg_func [2] | cfg-func [2] | |
| | 0 | 0 | 1 | 1 | 0 | cfg_func [3] | cfg-func [3] | |
| | 0 | 1 | 0 | 0 | 0 | cfg_func [4] | cfg-func [4] | |
| | 0 | 1 | 0 | 1 | 0 | cfg_func [5] | cfg-func [5] | |
| | 0 | 1 | 1 | 0 | 0 | cfg_func [6] | cfg-func [6] | |
| | 0 | 1 | 1 | 1 | 0 | cfg_func [7] | cfg-func [7] | |
| | 1 | 0 | 0 | 0 | 0 | cfg_func [8] | cfg_func [8] | |
| | 1 | 0 | 0 | 1 | 0 | cfg_func [9] | cfg_func [9] | |
| | 1 | 0 | 1 | 0 | 0 | cfg_func [10] | cfg_func [10] | |
| | 1 | 0 | 1 | 1 | 0 | cfg_func [11] | cfg_func [11] | |
| | 1 | 1 | 0 | 0 | 0 | cfg_func [12] | cfg_func [12] | |
| | 1 | 1 | 0 | 1 | 0 | cfg_func [13] | cfg_func [13] | |
| | 1 | 1 | 1 | 0 | 0 | cfg_func [14] | cfg_func [14] | |
| | 1 | 1 | 1 | 1 | 0 | cfg_func [15] | cfg_func [15] | |
| 001 (4in1out) [MODE 1] | 0 | 0 | 0 | 0 | 0 | cfg_func [0] | lat_dat | Split register |
| | 0 | 0 | 0 | 1 | 0 | cfg_func [1] | lat_dat | |
| | 0 | 0 | 1 | 0 | 0 | cfg_func [2] | lat_dat | |
| | 0 | 0 | 1 | 1 | 0 | cfg_func [3] | lat_dat | |
| | 0 | 1 | 0 | 0 | 0 | cfg_func [4] | lat_dat | |
| | 0 | 1 | 0 | 1 | 0 | cfg_func [5] | lat_dat | |
| | 0 | 1 | 1 | 0 | 0 | cfg_func [6] | lat_dat | |
| | 0 | 1 | 1 | 1 | 0 | cfg_func [7] | lat_dat | |
| | 1 | 0 | 0 | 0 | 0 | cfg_func [8] | lat_dat | |
| | 1 | 0 | 0 | 1 | 0 | cfg_func [9] | lat_dat | |
| | 1 | 0 | 1 | 0 | 0 | cfg_func [10] | lat_dat | |
| | 1 | 0 | 1 | 1 | 0 | cfg_func [11] | lat_dat | |
| | 1 | 1 | 0 | 0 | 0 | cfg_func [12] | lat_dat | |
| | 1 | 1 | 0 | 1 | 0 | cfg_func [13] | lat_dat | |
| | 1 | 1 | 1 | 0 | 0 | cfg_func [14] | lat_dat | |
| | 1 | 1 | 1 | 1 | 0 | cfg_func [15] | lat_dat | |

| cfg-mod [2:0] | idat [3] | idat [2] | idat [1] | idat [0] | odat_g [1] | odat_g [0] | odat-r | comments |
|---|---|---|---|---|---|---|---|---|
| 010 (2in1out) [MODE 2] | | | 0 | 0 | | cfg_func [0] | cfg_func [0] | Highest two bits and lowest 2 bits form two separate series. Register holds result for lowest 2 bits. |
| | | | 0 | 1 | | cfg_func [1] | cfg_func [1] | |
| | | | 1 | 0 | | cfg_func [2] | cfg_func [2] | |
| | | | 1 | 1 | | cfg_func [3] | cfg_func [3] | |
| | 0 | 0 | | | cfg_func [8] | | | |
| | 0 | 1 | | | cfg_func [9] | | | |
| | 1 | 0 | | | cfg_func [10] | | | |
| | 1 | 1 | | | cfg_func [11] | | | |
| 011 (2in1out) [MODE 3] | | | 0 | 0 | | cfg_func [0] | | Highest two bits and lowest 2 bits form two separate series. Register holds result for highest 2 bits. |
| | | | 0 | 1 | | cfg_func [1] | | |
| | | | 1 | 0 | | cfg_func [2] | | |
| | | | 1 | 1 | | cfg_func [3] | | |
| | 0 | 0 | | | cfg_func [8] | | cfg_func [8] | |
| | 0 | 1 | | | cfg_func [9] | | cfg_func [9] | |
| | 1 | 0 | | | cfg_func [10] | | cfg_func [10] | |
| | 1 | 1 | | | cfg_func [11] | | cfg_func [11] | |
| 100 (2in1out) [MODE 4] | | | 0 | 0 | | cfg_func [0] | lat_dat | Highest two bits and lowest 2 bits form two separate series. Split register. |
| | | | 0 | 1 | | cfg_func [1] | lat_dat | |
| | | | 1 | 0 | | cfg_func [2] | lat_dat | |
| | | | 1 | 1 | | cfg_func [3] | lat_dat | |
| | 0 | 0 | | | cfg_func [8] | | lat_dat | |
| | 0 | 1 | | | cfg_func [9] | | lat_dat | |
| | 1 | 0 | | | cfg_func [10] | | lat_dat | |
| | 1 | 1 | | | cfg_func [11] | | lat_dat | |
| 101 (3in1out) [MODE 5] | x | 0 | 0 | 0 | cfg_func [8] | cfg_func [0] | cfg_func [0] | MSB unused. Hold value of odat-g[0] |
| | x | 0 | 0 | 1 | cfg_func [9] | cfg_func [1] | cfg_func [1] | |
| | x | 0 | 1 | 0 | cfg_func [10] | cfg_func [2] | cfg_func [2] | |
| | x | 0 | 1 | 1 | cfg_func [11] | cfg_func [3] | cfg_func [3] | |
| | x | 1 | 0 | 0 | cfg_func [12] | cfg_func [4] | cfg_func [4] | |
| | x | 1 | 0 | 1 | cfg_func [13] | cfg_func [5] | cfg_func [5] | |
| | x | 1 | 1 | 0 | cfg_func [14] | cfg_func [6] | cfg_func [6] | |
| | x | 1 | 1 | 1 | cfg_func [15] | cfg_func [7] | cfg_func [7] | |
| 110 (3in1out) [MODE 6] | x | 0 | 0 | 0 | cfg_func [8] | cfg=func [0] | cfg_func [8] | MSB unused. Hold value of odat-g[1] |
| | x | 0 | 0 | 1 | cfg_func [9] | cfg_func [1] | cfg_func [9] | |
| | x | 0 | 1 | 0 | cfg_func [10] | cfg_func [2] | cfg_func [10] | |
| | x | 0 | 1 | 1 | cfg_func [11] | cfg_func [3] | cfg_func [11] | |
| | x | 1 | 0 | 0 | cfg_func [12] | cfg_func [4] | cfg_func [12] | |
| | x | 1 | 0 | 1 | cfg_func [13] | cfg_func [5] | cfg_func [13] | |
| | x | 1 | 1 | 0 | cfg_func [14] | cfg_func [6] | cfg_func [14] | |
| | x | 1 | 1 | 1 | cfg_func [15] | cfg_func [7] | cfg_func [15] | |
| 111 (3in1out) [MODE 7] | x | 0 | 0 | 0 | cfg_func [8] | cfg_func [0] | lat_dat | MSB unused. Split register |
| | x | 0 | 0 | 1 | cfg_func [9] | cfg_func [1] | lat_dat | |
| | x | 0 | 1 | 0 | cfg_func [10] | cfg_func [2] | lat_dat | |
| | x | 0 | 1 | 1 | cfg_func [11] | cfg_func [3] | lat_dat | |
| | x | 1 | 0 | 0 | cfg_func [12] | cfg_func [4] | lat_dat | |
| | x | 1 | 0 | 1 | cfg_func [13] | cfg_func [5] | lat_dat | |
| | x | 1 | 1 | 0 | cfg_func [14] | cfg_func [6] | lat_dat | |
| | x | 1 | 1 | 1 | cfg_func [15] | cfg_func [7] | lat_dat | |

Fig. 16

| Function | cfg-mode [2:0] | cfg-func [15:0] | comments |
|---|---|---|---|
| Inverter | 010/011/100 | xxxx_xxxx_xxxx_0101 | Use lowest bit |
| 2-input AND | 010/011/100 | xxxx_xxxx_xxxx_1000 | Use lowest 2 bits |
| 2-input NAND | 010/011/100 | xxxx_xxxx_xxxx_0111 | Use lowest 2 bits |
| 2-input OR | 010/011/100 | xxxx_xxxx_xxxx_1110 | Use lowest 2 bits |
| 2-input NOR | 010/011/100 | xxxx_xxxx_xxxx_0001 | Use lowest 2 bits |
| 2-input EXOR | 010/011/100 | xxxx_xxxx_xxxx_0110 | Use lowest 2 bits |
| 2-input EXNOR | 010/011/100 | xxxx_xxxx_xxxx_1001 | Use lowest 2 bits |
| 3-input AND | 101/110/111 | xxxx_xxxx_1000_0000 | Use lowest 3 bits |
| 3-input NAND | 101/110/111 | xxxx_xxxx_0111_1111 | Use lowest 3 bits |
| 3-input OR | 101/110/111 | xxxx_xxxx_1111_1110 | Use lowest 3 bits |
| 3-input NOR | 101/110/111 | xxxx_xxxx_0000_0001 | Use lowest 3 bits |
| FullAdder | 101/110/111 | 1110_1000_1001_0110 | Use lowest 3 bits. Carry in highest output bits. Sum in lowest output bits. |
| 4-input AND | 000/001 | 1000_0000_0000_0000 | |
| 4-input NAND | 000/001 | 0111_1111_1111_1111 | |
| 4-input OR | 000/001 | 1111_1111_1111_1110 | |
| 4-input NOR | 000/001 | 0000_0000_0000_0001 | |
| 4-input EXOR | 000/001 | 0111_1111_1111_1110 | |
| 4-input NOR | 000/001 | 1000_0000_0000_0001 | |
| AND_AND_OR | 000/001 | 1000_1000_1000_1000 | |
| AND_AND_NOR | 000/001 | 0111_0111_0111_0111 | |
| 4-input comparator(1111) | 000/001 | 1000_0000_0000_0000 | Values to be compared set at 1 |

DATA PROCESSING SYSTEM

TECHNICAL FIELD

The present invention relates to a data processing system with a reconfigurable logic circuit region.

BACKGROUND ART

Devices called FPGAs (Field Programmable Gate Arrays), PLDs (Programmable Logic Devices), and PLAs (Programmable Logic Arrays) are known as programmable devices where circuits can be reconfigured. Such programmable devices are fundamentally constructed by disposing units called logic cells or logic units in a lattice and disposing sets of wires so as to surround such units, with it being possible to change the functions of the logic cells or the connections of the wires based on information called context information or configuration information.

As one example of a technique for implementing parts of a logic circuit in FPGAs, Japanese Laid-Open Patent Publication No. 2000-40745 discloses a technique where an initial netlist that characterizes a logic circuit is divided into many pages and circuits for one of such pages are configured in an FPGA. By doing so, this technique aims to configure a much larger circuit than the physical capacity of the FPGA.

At present, system LSIs, which are mounted in multimedia devices, mobile devices, digital devices, and the like and execute much of the data processing of such devices, include a plurality of circuit units for realizing specific or dedicated functions (in many cases, such circuit units are called "hardware modules", "IP" (Intellectual Property) or "libraries") mounted on a single chip and such hardware modules carry out processing in parallel. Accordingly, if only a circuit is simply implemented in an FPGA using dividing, the ability of devices with reconfigure circuits has no great effect.

DISCLOSURE OF THE INVENTION

One of provisions of the present invention is a technique for dynamically optimizing a hardware space for executing one or more applications or when executing one or more applications. The present invention provides a data processing system, for example, an LSI, with architecture capable of obtaining and directly executing information that is not just conventional software information such as a program that is a group of instruction sets produced by compiler translation, but is also hardware information on the circuit itself that is to execute the application.

In conventional techniques for circuit devices as represented by system LSIs, circuits realized by hardware are installed as fixed hardware in units called "special-purpose hardware modules", "IP", and "libraries", with data being processed by a dedicated LSI constructed by such circuits. On the other hand, there are also techniques that performs as dedicated hardware circuits using a general-purpose circuit or architecture. One example is a simulator, where a general-purpose apparatus such as a CPU is given the role of executing the instructions in a program one by one to simulate an actual circuit. Here, even if a plurality of CPUs are used to convert the parallelism of a circuit realized by hardware into processing in units of instruction to be carried out using the CPUs, depending on the scale of the circuit being simulated, execution will take 1000 to 100,000 times longer than the time taken by an actual hardware circuit. Since real-time processing is also impossible, a great deal of testing time is required to simulate a complex circuit. For this reason, not only is it impossible to carry out processing in place of a modern special-purpose or dedicated LSI that has a huge number of gates, it is also becoming increasingly difficult to test the functions of complex dedicated LSIs.

In response to the problem of real-time performance, a method called "hardware acceleration" is known. According to this idea, in an initial stage, a plurality of CPUs or DSPs are aligned and operated in parallel and by assigning small-scale circuits to each, the overall simulation time can be reduced. Since FPGAs and PLDs have become available, methods that directly assign the circuit to be simulated to such devices have become predominant, with it becoming possible to emulate large-scale integrated circuits or hardware with performance that is extremely close to real-time performance.

However, the internal cell construction of an FPGA is an architecture where a certain amount of time is required to change the hardware circuit realized by the FPGA, and therefore FPGA are not suited to implementing hardware with data paths, such as a CPU or a DSP. In fact, when such hardware is implemented on an FPGA, it is not possible to compete with a specially designed LSI in terms of any of processing performance (operation frequency), gate efficiency, and power consumption. Also, depending on the circuit for executing an application, when an FPGA or PLD is used and the scale of the circuit to be implemented exceeds the degree of integration of the FPGA or PLD, as a rule such implementation will not be possible. Although it would be conceivable to implement the circuit for executing the application by dividing the circuit, in such case a plurality of chips are used, and due to the limited number of pins, performance, cost and power consumption become even worse.

In addition, when implementing divided circuits in a single FPGA, there are many problems causing of dividing the circuit, such as limits on the number of pins and the transmission of the boundary information between the divided circuits. If all of such problems are resolved at a design stage for hardware using FPGAs, the merits of using FPGAs over conventional techniques for designing and developing dedicated LSIs are lost. In addition, FPGAs and PLDs require between several times and several ten times the hardware of the intended hardware circuit, and therefore the chip cost, intended performance, and power consumption are all inferior to a dedicated LSI.

On the other hand, dedicated LSIs also have many problems. In the case of conventional dedicated or special-purpose LSIs, unless the correct intended performance and functional specification are available at the LSI design stage, there will be no convergence at the design stage. For example, depending on the execution state of the application, there are many cases where a dynamic tradeoff between function and performance is possible, but it is necessary to provide a hardware region that can realize the required performance at the design stage and an operation frequency that can ensure such performance for each function. That is, even when a dynamic tradeoff between function and performance is possible for an application, it is necessary to design an LSI having ensured both performance for peak performance requirements and implementing of each function on a unitary level. Accordingly, the requirements for both function and performance are crucial, and for system LSIs that require high performance and multifunctioning, costs build up in the worst case scenario, with manufacturing cost, chip area, and power consumption all worsening.

More specifically, in the case of an automatic or automated control apparatus, for example, a robot application, when processing sight information and hearing information, there are many cases where the processing load of other functions (a walking function, speech processing, olfactory processing, or the like) greatly decreases. However, in a conventional system LSI, all of the circuits for realizing all of the functions are implemented in the same way, with some circuits simply not using the processing result or being made to stand by with a reduced processing performance.

If the circuit configuration could be dynamically reconfigured, by dynamically optimizing the hardware space constructed by such reconfigurable logic circuits, the assigning of hardware resources to functions that are not used or are in the standby state can be greatly reduced, so that the hardware resources can then be collectively assigned to the sight information processing and/or hearing information processing where the resources should be concentrated. That is, in the present invention, unlike a conventional system LSI, there is no need to implement every hardware circuit (target circuit) and therefore it is possible to achieve maximum execution efficiency for fewer hardware resources.

A dynamic optimization technique in the present invention dynamically optimizes the arrangement of a real hardware space constructed by logic circuits, and is a concept that includes not only optimization that completely rearranges the real hardware space every time but also the dynamic optimization of part of the arrangement of the real hardware space. Accordingly, it is possible not only to release the assigning hardware resources to functions off used at present but also to reduce the assigning of hardware resources on standby use and to increase the assigning of hardware resources to functions in use without sacrificing the real-time response of functions on standby.

Also, the dynamic optimization technique in the present invention can, among the function that are being used, increase the assignment of hardware resources to functions requiring urgency and reduce the assignment of hardware resources or temporarily release the assignment of hardware resources to functions not requiring urgency. Here, "urgency" is a concept including processing speed and priority, and is an important requirement for a data processing system (apparatus and/or device). As other requirements for a data processing system that can affect the assigning of hardware resources, there are a variety of factors such as an increase or decrease in the number of jobs processed in parallel and the existence/absence of interrupts. The dynamic optimization technique in the present invention assigns hardware resources in accordance with such requirements for a data processing system, that is, the technique dynamically optimizes the configuration of an actual or a real hardware space.

One method of dynamically optimizing a real hardware space includes imagining every situation that can be encountered by a data processing system, determining in advance the arrangement of a real hardware space that is optimal for such situations, preparing context information (or configuration information), and loading such information every time. Appling this method, some problems that occur in the real hardware space, such as timing closure, can be resolved in advance, and therefore may be preferable in ensuring the performance of the data processing system. However, it is impossible to imagine every situation that can be encountered in every scenario. In addition, if a general-purpose solution that is fairly optimal for a limited number of situations and achieves moderate performance for others is used, the effect of dynamically optimizing the real hardware space is reduced.

Another method includes providing a hardware module (IP or library) designed as a unit for implementing a certain function in the form of a netlist that merely shows logic gates and the connected state of such, mapping part or all of the netlist, when such function becomes necessary, so as to be assigned and wired in accordance with the free space in the real hardware space dynamically. Since circuits can be flexibly and dynamically assigned in accordance with the momentary state of the real hardware space, such method can be thought of as being able to optimize the hardware space as dynamically as possible. However, an assigning and wiring process based on a netlist requires a huge amount of time even at the design and development stage of a static LSI, and such process needs to be repeated at every instant when mapping is carried out. It is impossible mapping instantaneously a required circuit based on a netlist after resolving problems such as place and route issue and reflecting the instantaneous actual state of a real hardware space and other elements. Even if it were possible to provide hardware that can resolve problems including timing closure at high speed almost in units of clocks or cycles, it is not economical to separately provide such hardware resources, and waiting for such hardware to be registered simply makes the realization of dynamic optimization of a hardware space more difficult.

At the stage of netlist, by separating partial circuits of an appropriate size in the circuit to be implemented by the netlist as units, resolving the place and route issues within such units of the partial circuit, disposing the partial circuits in free space in a real hardware space, and reducing the place and route issues for connecting such partial circuits when mapping of the partial circuits is performed, it may be possible to reduce the time required to resolve place and route issues in each instant where mapping is carried out. However, the state of the real hardware space constantly fluctuates during assigning and wiring. Accordingly, it is not easy to dynamically resolve place and route issues in every instant in accordance with the state, and even if it were possible, it would still be necessary to constantly consume hardware resources and power to do so, so that it is not possible to resolve the problem of providing a data processing apparatus with high performance and high functioning, a low chip cost, and low power consumption.

In the present invention, an architecture code is provided, the architecture code including object circuit information for mapping an object circuit that is at least part of a circuit for executing an application onto part of a logic circuit region, interface circuit information for mapping an interface circuit in contact with the object circuit onto the logic circuit region, and boundary condition to be realized in the interface circuit. One of the most optimal examples of such object circuits are a plurality of divided or divisional circuits produced by dividing a hardware module designed as a unit for implementing a given function when executing an application. When few hardware resources are required to implement a hardware module, the hardware module can be converted to an object circuit without being divided, with interface circuit information corresponding to such object circuit being generated and implemented in the logic circuit region.

A control method in the present invention for a data processing system including a logic circuit region where circuits are dynamically reconfigurable, includes a step of obtaining an architecture code, a step of mapping the object circuit and the interface circuit that comes in contact with the object circuit onto the logic circuit region according to the object circuit information and the interface circuit information of the architecture code, and an activating step of controlling the interface circuit based on the boundary condition of the architecture code.

A data processing system in the present invention includes: a logic circuit region where circuits are dynamically reconfigurable; a load unit for obtaining an architecture code; a mapping unit for mapping the object circuit and the interface circuit in contact with the object circuit onto the logic circuit region according to the object circuit information and the interface circuit information of the architecture code; and a behavior control unit for controlling the interface circuit according to the boundary condition of the architecture code. The load unit is a fetch unit in a case where the architecture code is supplied by fetching process and is a download unit in a case where the architecture code is supplied by downloading process from a memory or a communication network using a computer or the like. Although in the present specification, "loading" refers to a procedure as far as obtaining an architecture code, there are cases where "loading" includes mapping that reconfigures hardware according to loaded circuit information. A variety of instructions such as a "fetch", "download", "get", and "read" can be assigned to the process whereby the load unit obtains the code, and it is also possible to load the architecture code using a communication system.

The load unit, the mapping unit, and the behavior control unit can be regarded as single hardware modules respectively, and by dividing such modules and converting them to object circuits, such units can be implemented as divided circuits in the logic circuit region. Accordingly, when the conditions are such that some of the functions of the load unit, the mapping unit, and the behavior control unit only need to be realized according to the execution state of an application, the hardware resources assigned to such functions can be released or freed and assigned to realize other hardware modules, thereby improving the parallel processing performance and/or the processing speed.

In the present invention, an original netlist of a circuit for executing an application including hardware modules can be divided into partial circuits having appropriate ranges, place and route issues are resolved in the units of divided circuits, and object circuit information for mapping the divided circuit onto part of a logic circuit region can be generated. Next, interface circuit information can be generated from information forming boundaries of the object circuits configured by the object circuit information so as to the object circuits are fit in the original netlist. Hence, the original netlist is converted into an assembly of object circuits, place and route issues are resolved for the object circuits, and boundary conditions of the interface circuits are generated. Accordingly, place and route issues between and/or among the object circuits are resolved at the generation stage of the architecture code as boundary conditions to be realized in the interface circuits.

This means that when object circuits are disposed in a free space in a logic circuit region that is a real hardware space where circuits are dynamically reconfigurable, the load unit obtains a suitable architecture code, the mapping unit carries out mapping of the object circuits and also carries out mapping of interface circuits in the periphery of the object circuits, and the behavior control unit carries out control based on the boundary conditions of the interface circuits so that the object circuits are dynamically disposed in the real hardware space and the object circuits can be executed. Accordingly, by merely arranging desired or suitable object circuits and interface circuits in a logic circuit region based on the momentary state of the real hardware space, it is possible to execute the object circuits. The problem of having to resolve place and route issues between the object circuits at every moment can be prevented from the outset.

In the present invention, one or a plurality of object circuits mapped onto a reconfigurable logic circuit region that is a real hardware space can be executed in that state. The boundaries of object circuits are virtually connected to many object circuits that construct the hardware module to which that object circuit belongs via the interface circuit. To do so, the boundaries of the object circuit are controlled in the state of a virtual hardware space where many object circuits are connected. Accordingly, at the mapping, mapping of the object circuit and its interface circuit can be performed to any usable region in the logic circuit region that is a real hardware space.

When interface circuit information and boundary condition of an object circuit match or correspond at a boundary with those of an adjacent object circuit, this means that the object circuit that mapping is to be performed and the adjacent object circuit are the object circuits in contact with each other at the boundary in the virtual hardware space. Mapping of such object circuits can be performed so as to be directly connected or in contact with without passing the respective interface circuits. That is, the size of an assembly of actual object circuits mapped onto the real hardware space can be freely changed in accordance with the state of the real hardware space. It is possible to carry out mapping of a plurality of object circuits in a dispersed arrangement in the real hardware space or to carry out mapping of such circuits in a concentrated arrangement, so that the real hardware space can be used extremely flexibly.

It is also possible to connect object circuits that are spatially and/or temporally, presently or previously dispersed or mapped separating or dividing on the logic circuit region. By reflecting, using the behavior control unit, a state of an interface circuit of an object circuit mapped by spatial and/or temporal division in control of an interface circuit of another executed object circuit based on the boundary condition, it is possible to easily connect, in a virtual hardware space, object circuits that are spatially and/or temporally separated on the logic circuit region.

For this reason, it is preferable to provide a boundary information memory that stores a state of an interface circuit of an object circuit presently and/or previously mapped to the logic circuit region. Such object circuit to which a previous state is reflected includes the object circuit itself mapped spatially and/or temporally discontinuous. By doing so, even if a given object circuit is deleted from and then reproduced in the real hardware space according to certain conditions, continuous processing in such object circuit is possible in the virtual hardware space. It is also possible to configure a plurality of circuit instances for the same object circuit information to increase the parallelism or increase the reliability. Such control can be carried out according to architecture codes or according to the combination of the mapping unit and the behavior control unit.

The architecture codes in the present invention can be used in a variety of methods. By providing the architecture codes to be mapped on the real hardware space in a state where the architecture codes can be sequentially traced like the instruction sets of a program, it is possible to control a data processing system according to the architecture codes. The architecture codes can be provided by being recorded on a recording medium and can be provided via a communication means such as a network, with it being possible to change the hardware configuration by a remote operation.

In addition, as a method of using the architecture codes in place of a conventional system LSI, it is possible for the load unit to obtain a desired architecture code from an architecture library including a plurality of architecture codes based on information of behavior environment including requests to the data processing system (such as urgency, the start of a new job or changes in the parallel processing state, the presence/absence of interrupts), the execution state of the object circuits mapped, and the usable state of the logic circuit region, so that the hardware of the data processing system can be dynamically optimally configured based on the execution state of an application. The guidelines for the optimization can be determined based on the information of behavioral environment, to which one or more of the load units, the mapping units, and the behavior control units may contribute. To carry out mapping of a new object circuit onto free space in the real hardware space, delete completed object circuits, and give priority to mapping an urgent hardware module, the divided circuits of other hardware modules may be temporarily saved or the hardware resources assigned to other hardware modules can be temporarily reduced. In this way, there are no limits on how the real hardware space can be used.

Also, by converting hardware circuits to architecture codes, a great increase is made in the potential of a data processing system. When a system has limited use, an architecture library may be included in the data processing system. For example, it is possible to provide an automated control apparatus including the data processing system and a plurality of automated control mechanisms for which at least one of a plurality of hardware modules to be configured in the data processing system is used in respective control or data processing, wherein mapping of divided circuits of the plurality of hardware modules are dynamically performed in the logic circuit region. Here, when processing hearing information and sight information of a robot, the data processing system may be controlled so that hardware resources are mainly assigned to the divided circuits of the hardware modules required to control such processing and the divided circuits of the hardware modules required for other automated control mechanisms, such as a walking mechanism, are removed from the real hardware space.

On the other hand, by obtaining an architecture code via communication with the outside of the data processing system, such as a network, a system having a hardware space for mapping some object circuits can freely use a huge hardware property. As one example, it is possible to carry out mapping and use a great variety of hardware properties present on the Internet onto an LSI of a local mobile terminal. In combination with an apparatus with a variety of mechanisms, such as a robot, a variety of work can be carried out by a small resource. Also, since the architecture codes are always updated, a variety of works is performed using a control circuit being always up dated.

A terminal including the data processing system according to the present invention, mechanisms required for communication with the outside that cannot be realized by circuits, such as an antenna and connectors, and dedicated mechanisms for input and output, such as a display and microphone, can provides a variety of services including a various types of communication and others such as monitors the state of a living body. In addition, the circuit for carrying out such services includes a latest configuration that is always up to date.

The size of an object circuit is flexible but should be smaller than, including its interface circuit, the size of a logic circuit region on that mapping of the object circuit is performed. When the object circuit size is small, the real hardware space can be efficiently optimized. However, the amount of architecture code provided for a single hardware module increases. According to the present invention, if there is enough hardware space at the mapping, mapping of a plurality of object circuits can be performed together. Accordingly, there is no risk of the number of mapping iterations becoming huge due to the size of the object circuits, which would result in increased processing time. For a system including a reconfigurable architecture including a plurality of circuit blocks, each of the circuit blocks being constructed of a specified or predetermined number of reconfigurable circuit elements, architecture codes including object circuit information for mapping in units of the circuit blocks are useful.

The architecture codes included in the present invention can be applied to all data processing systems that include a logic circuit region where circuits can be dynamically reconfigured. However, in the case of hardware such as an FPGA that stores circuit configurations in lookup tables (LUTs), a number of clocks are needed to change the LUTs, resulting in the possibility of a noticeable fall in execution speed. The present invention provides a data processing system including a logic circuit region equipped with a plurality of elements that can be reconfigured in an extremely short time.

The elements in the present invention include an operation core for performing a logic operation on input data and outputs output data, and the operation core includes a selector into which a multibit function code that designates the logic operation is inputted and which selects the output data according to the input data. Since the logic can be changed by merely providing a function code that is inputted into the operation core, logic can be exchanged rapidly without needing to rewrite an LUT.

The elements preferably include n inputs and n outputs, where n is a plural (integer), an input interface that freely selects the input data out of the n inputs; and an output interface that freely selects output from at least one of the n inputs and the output data and outputs the output via at least one out of the n outputs. For example, with a logic circuit region that extends in two dimensions, one possible value of n is four, with it being possible to input data from any of the points of a compass (i.e., left, right, above, and below), and to output data in any of the four directions. With a logic circuit region that extends in three dimensions, one possible value of n is six, with it being possible to input data from any of left, right, above, below, in front, and behind, and to output data in any of the six directions. Also, the elements may function merely as connection switching elements that do not carry out a logic operation. In addition, the operation core should preferably include a register that latches one of the n inputs or the output data. By not using the registers, it is possible to configure a circuit such as a decoder suited to executing processing where there is no or little clock dependency. Conversely, by using the registers, it is possible to configure a circuit such as a state machine suited to executing processing with high clock dependency.

According to the present invention, it is possible to dynamically optimize a real hardware space in units of several clocks or cycles. This means that there is great freedom for tradeoffs, and therefore a number of conflicting demands, such as high performance and high functioning, low chip cost, and low power consumption can be simultaneously realized at a high level. Accordingly, the effectiveness of reconfigurable technology is greatly increased. Implementation efficiency in a circuit region that can be dynamically reconfigured is improved, the internal operation efficiency is also improved compared to a dedicated LSI, and a favorable solution in terms of all three of chip cost, performance, and power consumption can be provided. Also, since full use can be made of the characteristic whereby the dynamically reconfigurable hardware is programmable, it is possible to provide an architecture that as a rule does not appear the time for physical design, testing functions, and ensuring quality that is required for several months or more in a conventional LSI development.

That is, in the present invention, a feasible dynamic optimization technology of a hardware space is provided. In the present invention, system called an architecture code is provided in which hardware circuit information that has been conventionally provided by a physical entity and software information such as an instruction program that controls a hardware circuit are integrated and encoded as new information. Using the architecture codes, dynamically optimizing in an execution cycle for hardware becomes possible so as to trade off, at each moment, between hardware resources that become effective and the required processing performance under constraint conditions of the application requirements (architecture), and therefore, a reconfigurable chip can beat a dedicated LSI designed for a specified application in terms of all three of chip cost, required performance, and power consumption.

As fundamental techniques of architectures for achieving the dynamic optimization of a hardware space, followings can be nominated: a time divided execution technique of hardware circuits that includes dividing circuits and continuous execution of the divided circuit, a channel connecting technique for connecting a plurality of hardware circuits, dynamically generating/reducing/deleting techniques for hardware circuits, a compacting technique for hardware circuit information and a high-speed transmitting technique for the circuit information, a software technique for tradeoffs between application requirements and resources, and a high-speed emulation technique for hardware circuits and software information. The architecture codes in the present invention can support such techniques.

The architecture codes according to the present invention include object circuit information (divided or divisional circuit information), interface circuit information, and boundary conditions, but the architecture codes may also be roughly classified into hardware circuit information and software information. Hardware circuit information can include module interrelation information (static topology information and dynamic module execution information), a hierarchy structure, a priority order, exception process conditions, dynamic tradeoff conditions and the like of respective circuits for the case where 100% of the hardware resources are usable. The architecture codes can include all the information that provides supplementary support to functions of the hardware circuits and timing control, such as boundary conditions, with such information including software information such as a conventional instruction program and vector table and, depending on the application, data information such as images.

For example, in the case of a microprocessor, there are circuits, such as an external interrupt control unit and an exception processing unit, that are only necessary under special conditions, and circuits such as a decoder and a data path that are executed comparatively frequently. By using the architecture codes according to the present invention, it is possible to provide hardware and software information of a microprocessor as a collection of information is rearranged so as to be dynamically optimized for dynamic execution after reanalyzing hardware circuits hierarchically configured in the hardware space from the functional viewpoint of the microprocessor. Unlike a code for a typical program space, such information is constructed of a plurality of architecture codes for parallel execution. Out of the object circuits implemented by the architecture codes, architecture codes relating to circuits that are hard to waiting for exchanging are stored in a memory inside an LSI. The architecture codes relating to object circuits where circuit execution and activation are not urgent are stored in the external memory and are executed after being loaded from an external memory into an internal memory.

An architecture LSI that is one of the data processing systems included in the present invention can include: an external/internal rapid loading control unit (RLC) that includes the functions of the load unit and the mapping unit for translating the architecture codes onto hardware, initializing and executing the divided hardware circuit; a rapid logic communication master (RTM) that includes the functions of the execution control unit and carries out control of rapid logic exchanging operations and transmission (transfer) of hierarchical information; and a group of rapid logic exchanging elements (RXE) that form the logic circuit region and directly execute divisions of various hardware circuits (including test circuits). Embodiments of the present invention are described in detail below together with the other aspects, construction, and effects of the present invention.

BRIEF DESCRIPTION OF THE DRAWINGS

FIG. 14 shows example operations of an operation core.
FIG. 15 shows other example operations of an operation core.
FIG. 16 shows examples of logic operations that can be executed by an operation core.

BEST MODE FOR CARRYING OUT THE INVENTION

| | |
|---|---|
| 1 | data processing system |
| 2 | architecture library |
| 4 | program |
| 5 | RAM |
| 6 | RISC processor |
| 7 | interrupt detecting unit (IU) |
| 8 | clock generator |
| 9 | data input/output interface |
| 10 | logic circuit region (RC region, reconfigurable region or reconfigurable hardware) |
| 11 | rapid loading control unit (RLC) |
| 12 | rapid logic communication master (RTM) |
| 13 | load unit (LU) |
| 14 | mapping unit (MU) |
| 15 | boundary information memory |
| 16 | initial setting function |
| 18 | interface circuit |
| 19 | object, or divided, circuit |
| 20 | architecture codes |
| 21 | hardware circuit information |
| 22 | software information |

-continued

| | |
|---|---|
| 23 | divided (object) circuit information |
| 24 | interface circuit information |
| 25 | identification information for identifying the architecture code 20 |
| 26 | boundary condition |
| 27 | other information (such as information on a priority order with respect to other divided circuits, exception processing conditions, dynamic tradeoff conditions, and an execution order for the divided circuits) |
| 28 | architectural codes |
| 29 | architectural codes |
| 31 | step |
| 32 | step |
| 33 | step |
| 34 | step |
| 35 | step |
| 41 | step |
| 42 | step |
| 43 | step |
| 44 | step |
| 45 | step |
| 46 | step |
| 47 | step |
| 51 | circuit block (rxe_plane) |
| 52 | wires |
| 53 | logic element |
| 54 | buses of "layer 1" |
| 55 | buses "layer 2" |
| 61 | input routes (circuits) |
| 62 | output routes (circuits) |
| 63 | input interface |
| 63s | selector |
| 64 | output interface |
| 64s | selector |
| 65 | operation core |
| 66 | selector |
| 67 | decoder |
| 68 | register |
| 69a | selector |
| 69b | selector |
| 70 | robot |
| 71 | function A controls and carries out data processing for hearing (automated control mechanism) |
| 72 | function B controls and carries out data processing for sight (automated control mechanism) |
| 73 | function C controls and carries out data processing for speech (automated control mechanism)ability |
| 74 | function D controls and carries out data processing for physical functions(automated control mechanism) |
| 75 | communication, or functional, unit |
| 80 | terminal (that includes data processing system) |
| 81 | input/output mechanism |
| 82 | sensor (for detecting light, temperature, or the like) |
| 85 | mechanism |

Figure 1:
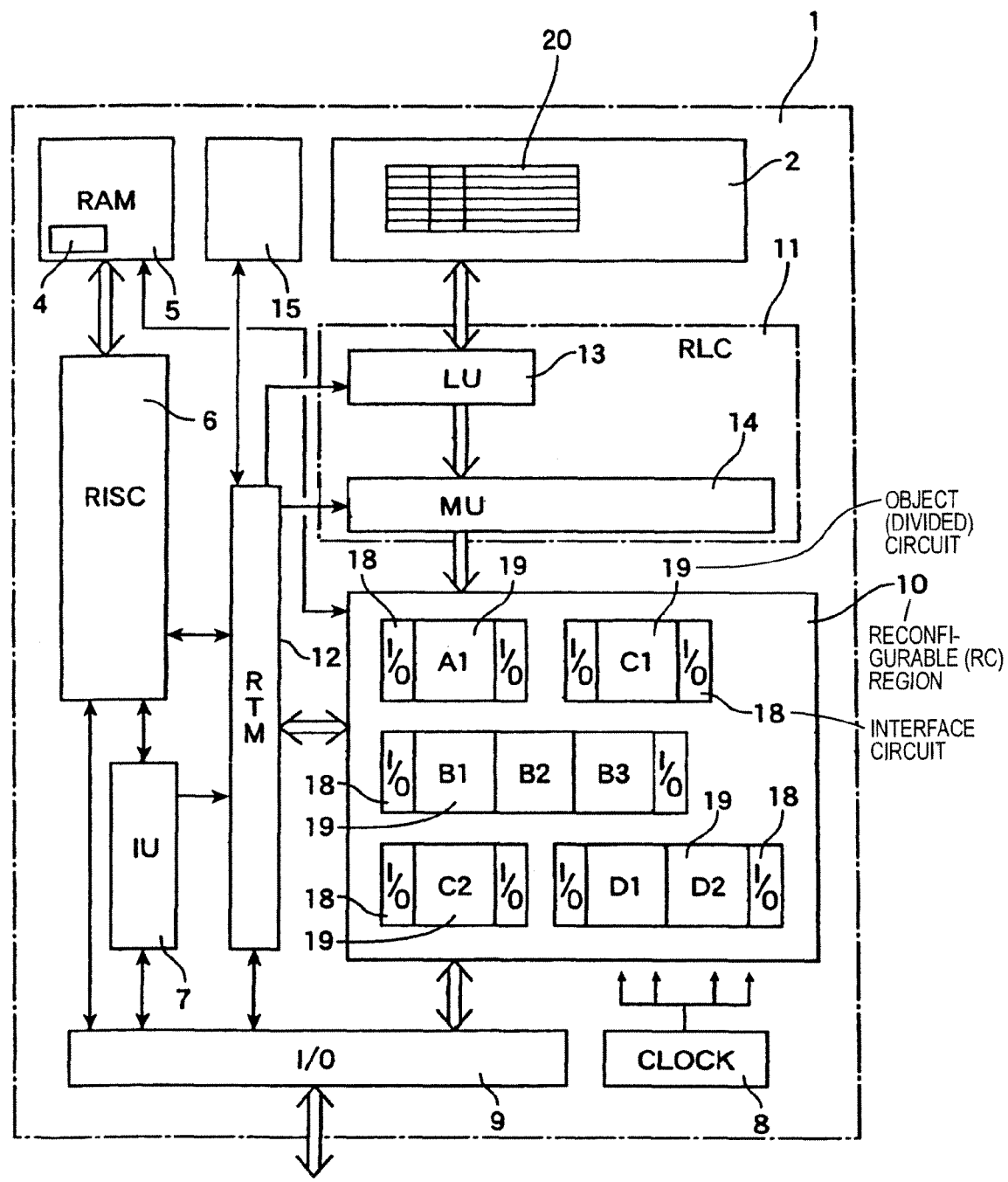
FIG. 1 shows the overall configuration of a data processing system in the present invention.

FIG. 1 shows one of a data processing system included in the present invention. The data processing system (apparatus or device) 1 is an architecture LSI and includes a logic circuit region ("RC region" or "reconfigurable region") 10 where circuits can be dynamically reconfigured, an architecture library 2 in which a number of architecture codes 20 of hardware modules are stored, a rapid loading control unit (RLC) 11 that can translate the architecture codes 20 on the reconfigurable hardware 10 and initialize and execute the divisional hardware, and a rapid logic communication master (RTM) 12 that can carry out control of a rapid logic circuit exchanging operation and transmission (transfer) of hierarchical information. The RLC 11 includes a function as a load unit (LU) 13 that obtains (i.e., fetches or downloads) the architecture codes 20 from the library 2. In addition, the RLC 11 includes a function as a mapping unit (MU) 14 that carries out mapping of object circuits 19 and interface circuits 18 so as to be in contact with the object circuits 19 onto the RC region 10 using object circuit information and interface circuit information of the architecture codes 20. The RTM 12 includes a function as a behavior control unit that controls the interface circuits 18 in accordance with boundary conditions of the architecture codes. Also, the RTM 12 includes a function for storing, as necessary, the states of the interface circuits 18 of the object circuits 19 presently and/or previously mapped onto the RC region 10 in a boundary information memory 15 and transmits such information between the object circuits 19.

In the description below, the object circuit information of the architecture codes 20 is generated so as to perform mapping of a partial hardware module that is divided into suitable ranges, onto the RC region 10. Accordingly, the object circuits 19 configured in the RC region 10 by the object circuit information are divisional circuits produced by dividing a hardware module designed as a unit for implementing a given function. The present invention is further described below with architecture codes 20 that include divided circuit information as object circuit information and divided circuits 19 as examples.

The data processing system 1 further includes a RAM 5 in which a program 4 for executing an application is stored, a RISC processor 6 that carries out processing using the hardware resources of the data processing system 1 in accordance with the program 4, an interrupt control unit 7 that receives interrupt signals, a clock generator 8 that supplies a clock signal to the various hardware resources of the data processing system 1, and a data input/output interface 9 that controls inputs and outputs of data to and from an external memory. The code RAM 5 can also be accessed from the RC region 10.

Figure 2:
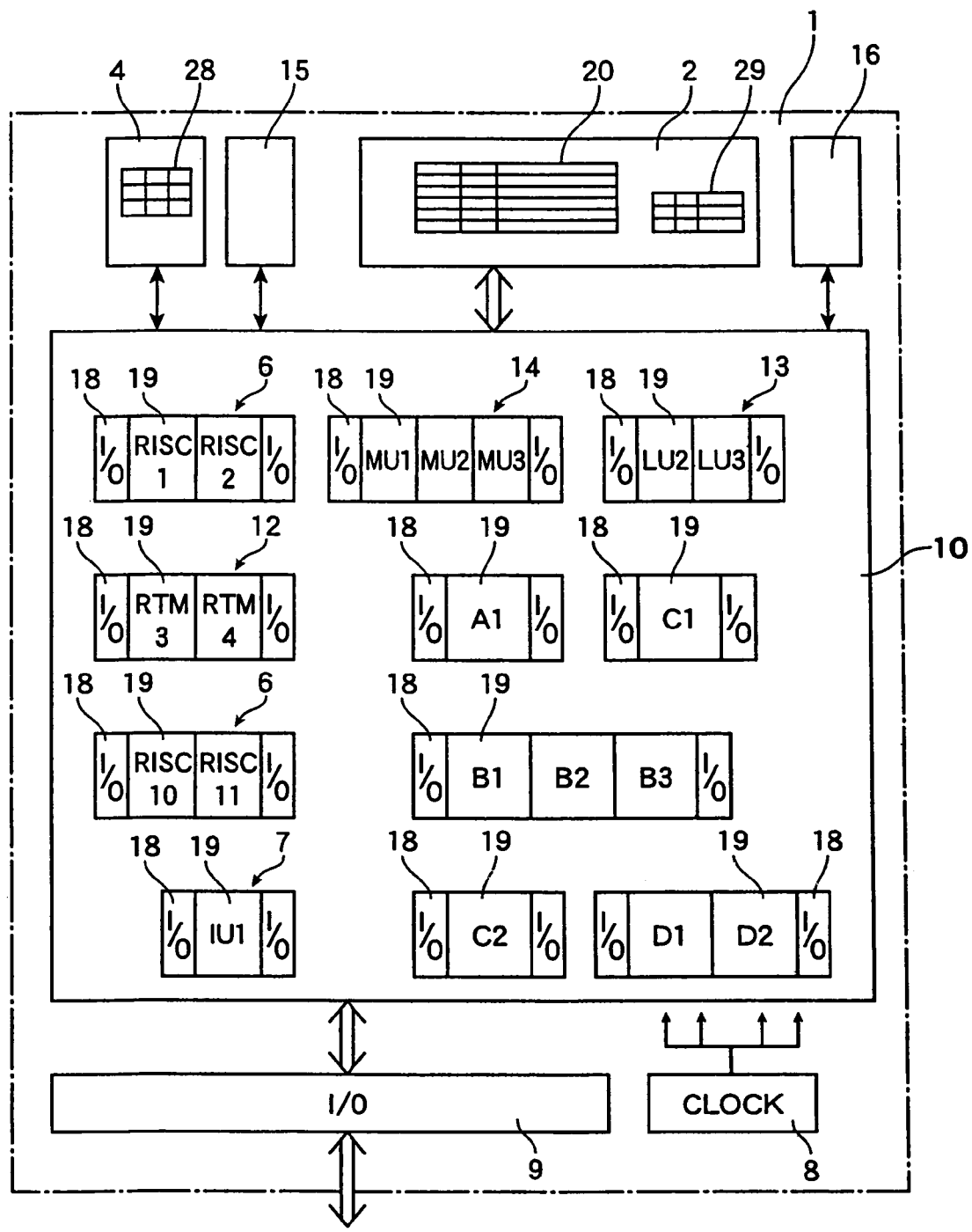
FIG. 2 shows a different example of a data processing system in the present invention.

FIG. 2 shows a different example of a data processing system (apparatus or device) 1 included in the present invention. Hardware functions as a CPU or a DSP can be provided by one or a plurality of hardware modules (hardware macros). In the same way, the various functions of the load unit (LU) 13 for loading the architecture codes 20, the mapping unit (MU) 14, and the behavior control unit (RTM) 12 can be provided by one or a plurality of hardware modules respectively. In addition, an interrupt detecting unit (IU) 7 can also be provided by a hardware module. Accordingly, by converting such hardware modules into divided circuits, the hardware modules can be dynamically configured in the RC region 10 using the architecture codes. This means that with the data processing system 1 shown in FIG. 2, by the divided circuits 19 and the interface circuits 18, the functions of the processor 6, the LU 13, the MU 14, and the RTM 12 can be partially or if necessary entirely realized respectively in the RC region 10.

Accordingly, in this data processing system 1, since the functions of the RISC processor 6 are realized using the RC region 10, control of the data processing system 1 including control of the RC region 10 is carried out by circuits mapped on the RC region 10. In such data processing system, a function realized by a fixed hardware configured thereon is an initial setting function 16 for mapping some circuits for starting or resetting the data processing system that is the architecture LSI 1, on the RC region 10 of the LSI 1 when starting or resetting the LSI 1. The initial setting function 16 may be provided as an independent circuit or may be provided by including in the minimum required functions for managing and controlling the RC region 10, such as the RTM 12 and the functions are realized by the fixed hardware.

In this way, by using circuits mapped onto the RC region 10, it is possible to control the data processing system 1 itself, including control over the RC region 10. Accordingly, by providing architecture codes 28 including codes for controlling over the data processing system 1 in the RAM 4, it is possible to control the data processing system 1 using architecture codes 28. Here, control by a conventional program including a plurality of instruction sets can be replaced with control by the architecture codes 28. This means that by providing the architecture codes 28 via a recording medium, network, communication, or the like, it is possible to implement not only hardware information but also conventional software information in the data processing system 1, thereby increasing the flexibility of the data processing system 1.

Architecture codes that provide functions such as the LU 13, the MU 14, and the RTM 12 that are necessary to execute applications and have general or versatile applicability for a plurality of applications performed on the data processing system 1 can be supplied independently of the architecture codes 20 for applications as the architecture codes 29 that support the fundamental functions of the data processing system 1. Such architecture codes 29 that support the fundamental system can be handled like an OS or BIOS of a processor that runs on a conventional program base. In addition, by providing hardware that supports the fundamental system as the architecture codes 29, when an exchanging operation is not necessary for the RC region 10 or when it is possible to reduce the cycle of exchanging operations, it is possible to release regions occupied by hardware used for exchanging operations of the RC region 10 to mapping of hardware used for executing an application. For this reason, it is possible to provide an LSI that can improve the usage efficiency of the RC region 10 and can achieve maximum processing performance for few hardware resources.

Figure 3:
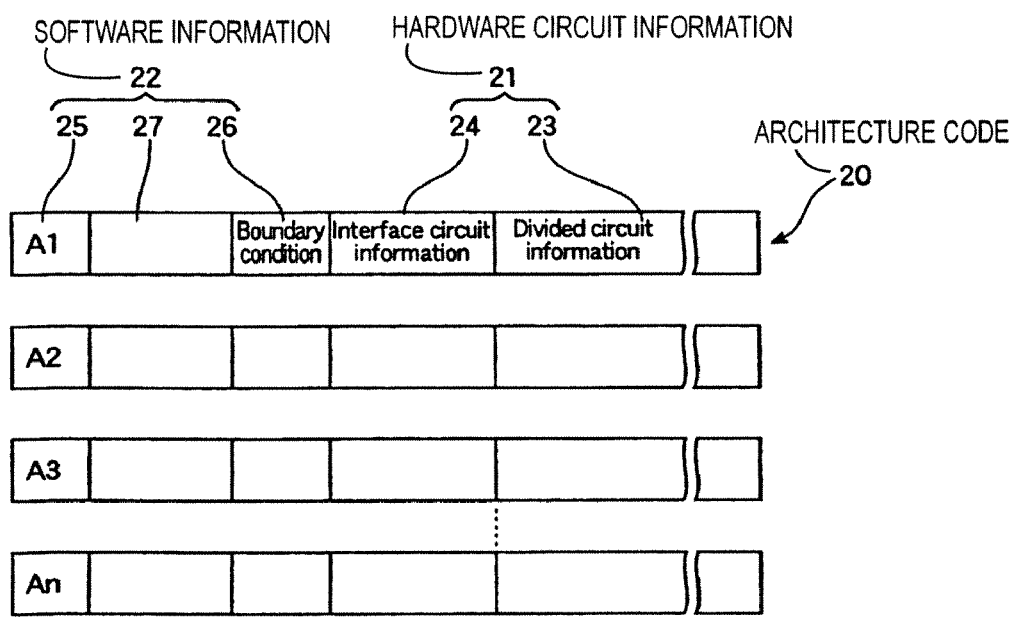
FIG. 3 schematically shows architecture codes.

FIG. 3 shows examples of architecture codes 20. The architecture codes 20 are respectively includes hardware circuit information 21 and software information 22. The hardware circuit information 21 includes divided circuit information 23 for mapping, onto part of the RC region 10, divided circuit 19 that is one of a plurality of divided circuits produced by dividing a hardware module (IP or library) designed for implementing a given function unit as a circuit, and interface circuit information 24 for mapping interface circuit 18 in contact with the divided circuit 19 onto the RC region 10. The software information 22 of an architecture code 20 includes identification information 25 for identifying the architecture code 20, boundary condition 26 to be realized in the interface circuit 18, and also other information 27, such as information on a priority order with respect to other divided circuits, exception processing conditions, dynamic tradeoff conditions, and an execution order for the divided circuits. The architecture codes 20 clearly show all of the primitive function information and topology for configuring the divided circuits and also show the functions of the individual divided circuits 19 and the connections between the divided circuits 19.

In the data processing system 1 of the present embodiment, for example, circuit configurations (hardware module) for realizing the function labeled "A" in FIGS. 1 and 2 are provided as the architecture codes 20 numbered A1 to An. Also, circuit configurations for realizing the function labeled B are provided as the architecture codes 20 numbered B1 to Bm, circuit configurations for realizing the function labeled C are provided as the architecture codes 20 numbered C1 to Cx, and circuit configurations for realizing the function labeled D are provided as the architecture codes 20 numbered D1 to Dy. Note that n, m, x, and y are suitable integers.

Figure 4:
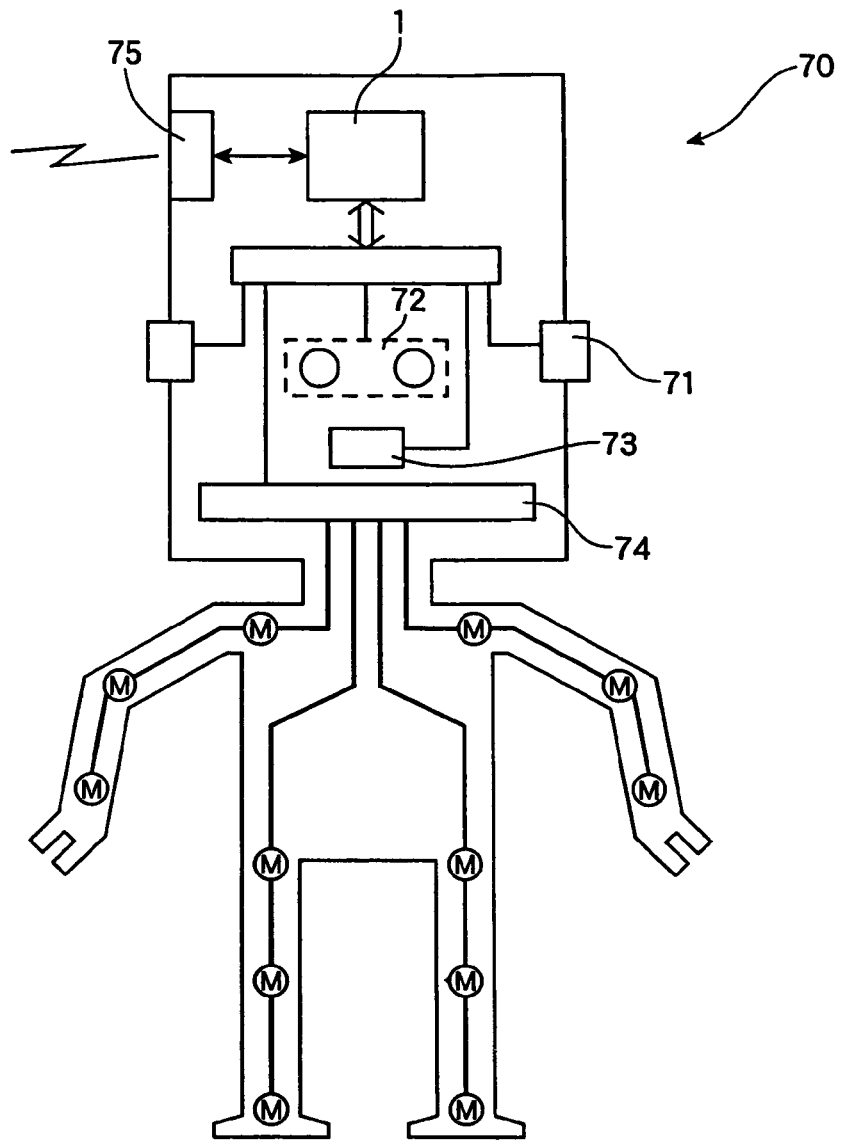
FIG. 4 shows the overall configuration of a robot controlled by the data processing system.

As shown in FIG. 4, when the data processing system 1 controls a robot 70 as one example of an automated control apparatus, the function A controls and carries out data processing for hearing 71, the function B controls and carries out data processing for sight 72, the function C controls and carries out data processing for speech ability 73, and the function D controls and carries out data processing for physical functions 74. Divided circuits for the hardware modules (module A to module D) of this plurality of automated control mechanisms 71 to 74 are dynamically mapped onto the RC region 10 of the data processing system 1. In the RC region 10, areas occupied by the hardware modules for the respective mechanisms 71 to 74 are dynamically controlled. For example, when the robot 70 carries out a conversation, large demands are made by the hearing, sight, and speech function, and the areas occupied by the divided circuits 19 for the functions A, B, and C are increased. On the other hand, when carrying out an operation that uses the body of the robot 70, large demands are made by the vision and physical functions, and therefore the areas occupied by the divided circuits 19 for the functions B and D are increased.

This robot 70 also includes a functional unit 75 for connecting with the outside, for example, a computer network such as the Internet via a wireless or wired connection. Accordingly, it is possible to download the architecture codes for realizing the various functions from outside. For this reason, there are fundamentally no limitations on the types of work that can be realized by the robot 70. Also, by updating the architecture codes at the supplier of the architecture codes, it is possible to control the robot 70 using hardware modules that are always up-to-date, and therefore the problem of hardware obsolescence can be solved. It is also possible to carry out remote control over the robot 70 using architecture codes. Out of the functions required for communication with the outside, functions that can be covered by circuits are fundamentally realized by the data processing system 1 of the present embodiment using architecture codes. Accordingly, the communication unit 75 includes hardware that cannot be covered by circuits, such as an antenna and connectors.

When up to the communication function cannot be covered by a single data processing system 1, another data processing system 1 for communication purposes may be mounted to support the communication function. It is also possible to supply a system designed that, when the load of the communication function is small, the additional data processing system 1 supports other functions. In the same way as the other functions, one or a plurality of data processing system 1 were provided centrally or in a distributed manner as the physical functions, and when the load of the physical functions is small, such data processing systems 1 can be used for other functions such as speech processing.

Figure 5:
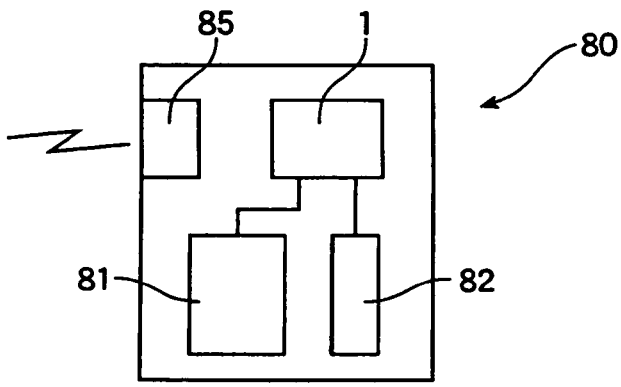
FIG. 5 shows the overall configuration of a terminal including the data processing system.

FIG. 5 shows the overall arrangement of a terminal 80 that includes the data processing system 1. The terminal 80 also includes a mechanism 85 for communicating with the outside. Accordingly, by downloading architecture codes from the outside, a variety of services can be provided by the terminal 80. By installing an input/output mechanism 81 such as a display, a microphone, a speaker, and the like, all of the services required for inputting and outputting images, sound, and the like can be provided. In addition, by installing a sensor 82 for detecting light, temperature, or the like, it is possible to provide not only services such as a camera and thermometer but also a variety of other services using the sensor 82, such as monitoring a living body. Also, by downloading architecture codes from the outside, it is possible to use functions of hardware modules that are always up-to-date.

Figure 6:
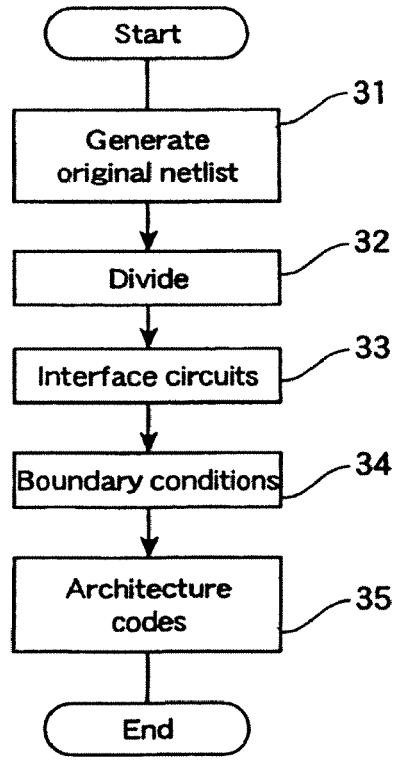
FIG. 6 is a flowchart showing a process that generates architecture codes.

FIG. 6 shows a method of generating the architecture codes 20. First, in a step 31, an original netlist of a hardware module is generated. A variety of methods are known for carrying out processing up to the generation of the netlist that use a high-level language such as C or a hardware description language such as Verilog, and any of such methods may be used. In step 32, the original netlist is divided into a number of units and the divided circuit information 23 is generated by resolving the place and route issues to enable the respective divided ranges of such divided units to be mapped on the RC region 10.

The divided circuits 19 to be mapped onto the RC region 10 are divided so as to. be assigned using one or a plurality of circuit blocks, which are suitable ranges of configuring the hardware of the RC region 10, as units. By using this method of division, it is possible to efficiently assign the divided circuits 19 to the RC region 10. Dividing where the exchanging of data between the divided circuits 19 frequently occurs is not preferable for mapping the individual divided circuits 19 onto the RC region 10. In this invention, problems caused by such dividing can be solved by assigning a priority order so that a combination of such divided circuits 19 is simultaneously mapped whenever allowed by the state of the RC region 10. The data processing system 1 in the present invention may allow or be compliant with a variety of methods of dividing a netlist. However, in step 32, the division of the original netlist and assignment to the hardware of the RC region 10 should preferably be carried out repeatedly so as to obtain optimal divided circuit information 23.

In step 33, the interface circuit information 24 is generated from information that forms the boundaries of the divided circuits 19 on the original netlist. For the boundaries where in contact with the adjacent divided circuits 19, the interface circuit information 24 are the same. The architecture codes are therefore generated so that parts of the interface circuit information 24 are the same.

Next, in step 34, the original netlist is converted to a group or an assembly of divided circuits 19 and the place and route issues including timing closure issues between and/or among the divided circuits are resolved so that the function as a hardware module is realized by the divided circuits 19, thereby generating the boundary conditions 26 for the interface circuits 18. By the boundary conditions, at the boundaries between adjacent divided circuits 19, states that the boundaries are coincide and/or such divided circuits 19 are connected are realized, and therefore, the boundary conditions have equal or matching conditions in parts where the interface circuit information 24 is the same or has corresponding constructions. For this reason, the architecture codes are generated with boundary conditions 26 with common parts or parts that correspond.

Compiling of the information described above is performed for mapping the divided circuits to the hardware space (logic circuit region) 10 and realizing a function as a hardware module. At the compiling stage, information relating to a priority order with respect to other divided circuits, exception processing conditions, dynamic tradeoff conditions, and an execution order of the divided circuits is obtained. In step 35, the architecture codes 20 are generated so as to include such information. A hardware module is configured in a virtual hardware space by a plurality of divided circuits 19 and the architecture codes 20 make it possible to realize and execute part of such hardware module in the RC region 10 that is a real hardware space. The divided circuits 19 mapped onto the RC region 10 can be referred to as "circuit instances".

The virtual hardware space and real hardware space are connected via the interface circuits 18, and solutions to problems of place and route on a real hardware space, including timing closer, are indicated by controlling the interface circuits 18 using the boundary conditions 26. Accordingly, in a virtual hardware space and in a real hardware space, it is possible to realize software-like processing and hardware-like processing using the desired divided circuits 19.

Figure 7:
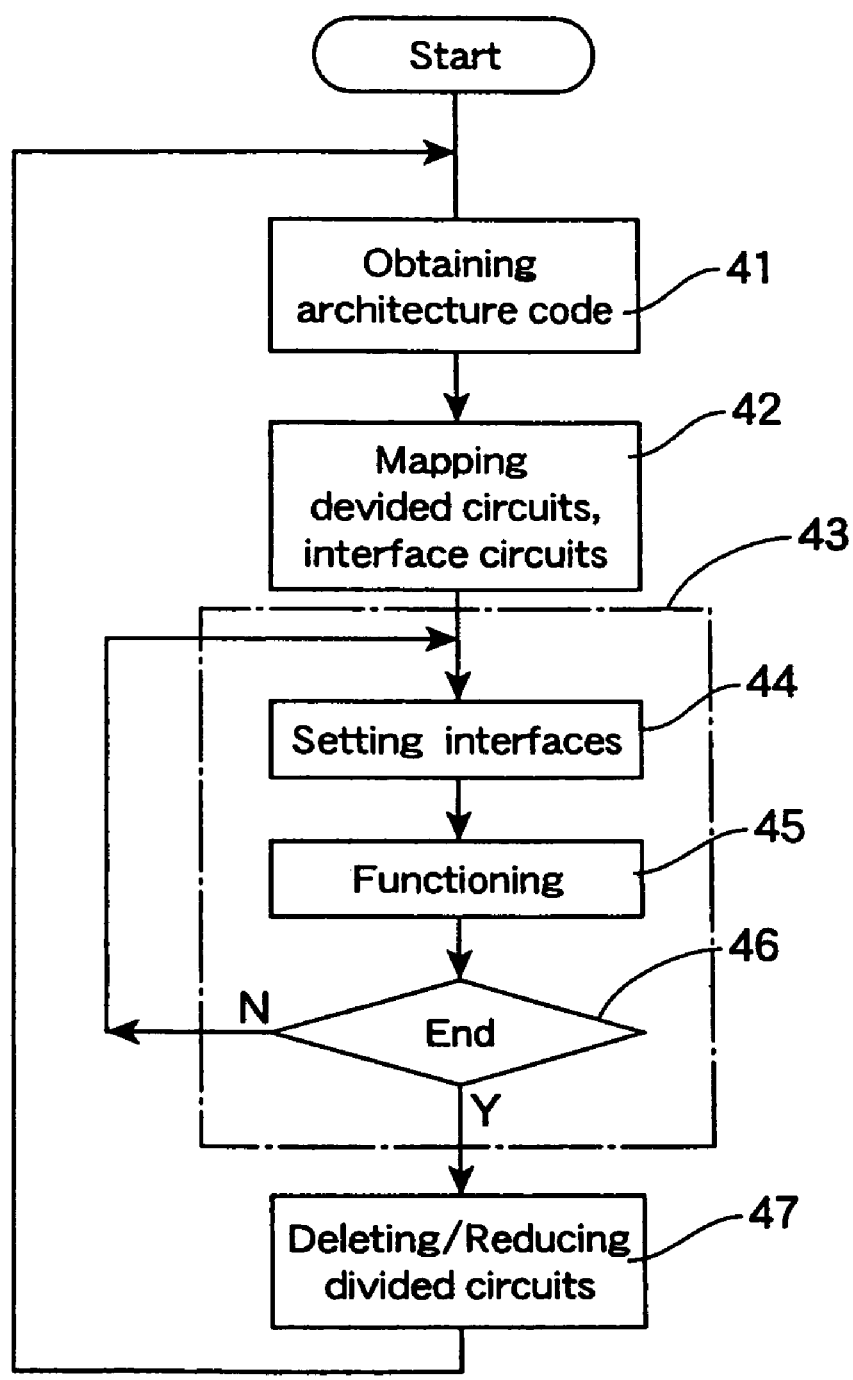
FIG. 7 is a flowchart showing a process that executes an architecture code in a data processing system.

FIG. 7 shows a process including generating and executing the divided circuits 19 and the interface circuits 18 in the RC region 10 of the data processing system 1 using the architecture codes 20. First, in step 41, the load unit 13 obtains the architecture codes 20 designated by the RTM 12 from the library 2. In the data processing system 1 of, there is a case where the RISC processor 6 executes an application program 4 and a case where the data processing system is controlled by a configuration realized in the RC region 10 by the architecture codes 28, and in either case, the RTM 12 determines the architecture codes to be obtained based on information of operational or behavioral environment and outputs an instruction to the load unit 13. Information of behavioral environment includes requests to the data processing system 1 obtained from the program 4 or architecture codes 28, interrupt information from the interrupt control unit 7, execution states of the divided circuits 19 mapped to the RC region 10, and a usable state of the RC region 10 (presence/absence of free space, presence/absence of replaceable divided circuits, and the like).

If the code 20 is stored in the library 2, the load unit 13 outputs an address and fetches the code 20. If the load unit 13 is equipped with a suitable communication function, it is also possible to obtain the code 20 from another data processing apparatus, an external memory, or a server connected by a network or another resource on a network. In the same way as the architecture codes 28, by using a configuration where the architecture codes are forcibly or actively loaded by the load unit 13, it is possible to actively control the processing on the data processing system 1 via the architecture codes.

In step 42, the mapping unit 14, using the divided circuit information 23 and the interface circuit information 24 of the architecture codes 20 obtained, performs mapping of the divided circuits 19 and the interface circuits 18 so as to come in contact with the divided circuits onto the RC region 10 respectively. Since the state of the RC region 10 can be grasped with highest precision by the RTM 12 that controls the execution of the divided circuits 19, based on instructions from the RTM 12, the mapping unit 14 carries out mapping of the divided circuits 19 and the interface circuits 18 to a free hardware space or a replaceable hardware space in the RC region 10. At this time, when the interface circuit information 24 and the boundary conditions 26 of the boundaries between the divided circuits 19 mapping adjacently match or correspond, this means that the divided circuits 19 are adjacent in the virtual hardware space, and therefore it is possible to connect the circuits directly in the real hardware space 10. Accordingly, mapping of the divided circuits 19 is performed so that adjacent divided circuits are directly connected without passing (without being connected via) the respective interface circuits. Note that in FIGS. 1 and 2, to simplify the drawings, the interface circuits 18 are formed on only the right and left sides of the divided circuits 19 respectively. When the divided circuits 19 include wires for connecting not only the right and left sides but also the upper and lower sides, the interface circuits 18 are arranged so as to encapsulate the divided circuits 19 on the upper, lower, left, and right sides of the divided circuits 19 respectively. In addition, if the RC region 10 extends in three dimensions and the divided circuits 19 are also circuits that extend in three dimensions, the interface circuits 18 are composed so as to encapsulate the divided circuits 19 in three dimensions.

In principle, mapping of the divided circuits 19 is performed on a free region of the RC region 10. If, according to the behavioral environment information grasped by the RTM 12, mapping of new divided circuits 19 urgently need with priority over divided circuits that have already been mapped on the RC region 10, it is possible to erase or delete the mapping of the divided circuits 19 that have already been made or to reduce such mapping of the circuits to produce a free region. Remapping of such other divided circuits 19 that have been deleted can be performed onto the RC region 10 after the urgent state has passed, and then activated from the start or from a midpoint. Also, the other divided circuits 19 that mapping area have been reduced, by repeating the process for mapping the divided circuits 19, although the processing speed will fall, the processing of other functions achieved by such divided circuits can be continuously executed. In this way, in the data processing system 1, depending on information such as the information of behavioral environment, unexpected mapping of divided circuits 19 can be carried out onto the RC region 10. It is possible to grasp the situations faced by an application in advance from a simulation or the like and to carry out scheduling so that the desired divided circuits 19 are mapped at predetermined positions in the RC region 10, which makes it possible to improve the usage efficiency of the RC region 10.

In step 43, the mapped divided circuits 19 are activating. To activate the divided circuits 19, in step 44, the interface circuits 18 are controlled based on the boundary conditions 26 to supply predetermined data to the divided circuits 19 at predetermined timing. In step 44, by using the functions of the RTM 12, the states of the interface circuits 18 of other divided circuits 19 that have been mapped in the RC region 10 at present and/or previously to spatially and/or temporally divide the RC region 10 are reflected, based on the boundary conditions 26, in the control of the interface circuit 18 of the divided circuits 19 to be activating. Accordingly, in step 45, the divided circuits 19 realized in the real hardware space have the same states as in a virtual hardware space in which the other divided circuits in the periphery are connected, so that as a hardware module is in functioning by the divided circuits 19 belong to the hardware module and being realized on the real hardware space. Also, since the result of the operation or working of each divided circuit 19 is outputted to the interface circuit 18, the RTM 12 spatially transmits the state of such interface circuits 18 to the interface circuits 18 of other divided circuits 19 already mapped onto the RC region 10 and after some time has passed, transmits the state to the interface circuits 18 of other divided circuits 19 that will be mapped next onto the RC region 10. By doing so, it is possible for signals to propagate in the virtual hardware space according to the netlist, thereby realizing the function of the hardware module.

The boundary information set in the interface circuits 18 can be stored in advance in the memory 15. If there is a long time until another divided circuit 19 is mapped or a divided circuit 19 has been deleted mid-operation, by setting boundary information stored in the memory 15 in the interface circuit 18, it is possible to cause the divided circuit 19 to operate or repeat an operation with the desired conditions.

In step 46, steps 44 and 45 are repeated until the requests to have the mapped divided circuits 19 active are completed. After this, the divided circuits 19 whose processing has terminated are deleted from the RC region 10 in step 47. Alternatively, if there is space in the RC region 10, if it has been predicted that the functions of the divided circuits 19 will again become necessary, the divided circuits 19 may be reduced and kept in the RC region 10. If there is more free space in the RC region 10, the divided circuits 19 may be left as they are. When divided circuits 19 that need to operate repeatedly on consecutively inputted data are mapped, the divided circuits 19 are present in the RC region 10 until the processing is terminated. If the processing speed can be raised by increasing the parallelism, a plurality of circuit instances of the same divided circuit 19 may be mapped to increase the processing speed. Also, a plurality of circuit instances may be configured in the RC region 10 for the same architecture code 20 and the outputs of such instances may be compared to realize highly reliable processing. It is also possible to determine whether high reliability is required and/or whether high processing speed is required and control the data processing system 1 so as to automatically use an appropriate construction. On the other hand, like in a state machine, when the processing content changes in order due to a change in state, different divided circuits 19 are mapped one after the other.

Mapping of the divided circuits 19 that are the circuit instances, to dynamically optimize the hardware space, can require the RTM 12 that is the table master to activate and/or delete other circuit instances. The RTM 12 generates, deletes, copies, moves, and connects channels for a plurality of circuits, so that functions that originally can only be performed by a large scale circuit that is assigned and configured as the large scale circuit as it is in a physical space, can be carried out by generating only the limited circuits that are required at each respective moment as circuit instances in the hardware space and dynamically optimizing the circuit instances. Therefore, it becomes possible to an extremely large number of circuits be in operation in parallel virtually using a hardware space with few resources.

The divided circuits 19 configured in the hardware space can be categorized into types such as permanent circuits that are always present or existed on the logic circuit region (circuit plane) 10 of the data processing system (architecture LSI) 1, instant circuits that are generated and are only existed for a predetermined time, and cyclic circuits that are generated at intervals of a predetermined time. When some actual execution are carried out in instant circuits and cyclic circuits, before the circuits are deleted, the circuits notify the RTM 12 of information on the execution results which is to be provided to other circuits and such information is stored. This circuit execution information is always efficiently transmitted to the other divided circuits 19 to be generated next. The RTM 12 carries out circuit control so that the execution information is efficiently transmitted between instant circuits.

The determining of the activation order of the divided circuits 19 is carried out by a circuit compiler of the development frame work (FW) during the development stage that generates the architecture codes 20 shown in FIG. 6. When there is a change in the circuit activation order of the divided circuits 19 due to an external signal or data input conditions, the RTM 12 controls the activation of such divided circuits 19. On the other hand, when the activation order can be completely controlled by the divided circuits themselves, the RTM 12 expands and reduces the execution areas of circuits in accordance with the priority order of the entire system.

For example, in the RC region 10 in FIG. 1, the divided circuit A1 of the module A for realizing the function A is embodied together with the interface circuits, and the divided circuits B1 to B3 of the module B for realizing the function B are embodied together with the interface circuits. Since the divided circuits B1 to B3 are generated in a continuous part of the RC region 10 as continuous circuit instances, the boundaries of adjacent divided circuits are continuous and the interface circuits 18 are only formed at the boundaries to the outside of the continuous divided circuits. It should be noted that to simplify the explanation, the interface circuits 18 are realized only on the left and right sides in the drawings, but when the divided circuits are connected above and below in the virtual hardware space, there are cases where interface circuits are generated in the same way as described above.

For the module C that realizes the function C, the divided circuits C1 and C2 are mapped in the RC region 10 but are separated spatially. For this reason, the interface circuits 18 are embodied for the respective divided circuits C1 and C2, with the divided circuits C1 and C2 being connected via the RTM 12. Also, for the module D that realizes the function D, the divided circuits D1 and D2 are mapped in a connected state. The RTM 12 activates the interface circuits 18 of such divided circuits 19 by setting data at appropriate timing in the interface circuits 18, and as a result, data outputted to the interface circuits 18 is stored and is transmitted to the interface circuits 18 of connected divided circuits 19 produced by spatial or temporal division.

Also, the RTM 12 can change the type, that is, the frequency, of the clock signal supplied from the clock generator 8 to the divided circuits 19 of the RC region 10, according to the architecture codes 20 of the divided circuits 19 and the behavioral environment information for the divided circuits 19. It becomes possible to minimize the power consumption of the RC region 10, and to maintain the maximum performance. As a rule, clock signals are not supplied to regions in the RC region 10 to which circuit instances have not been mapped.

Figure 8:
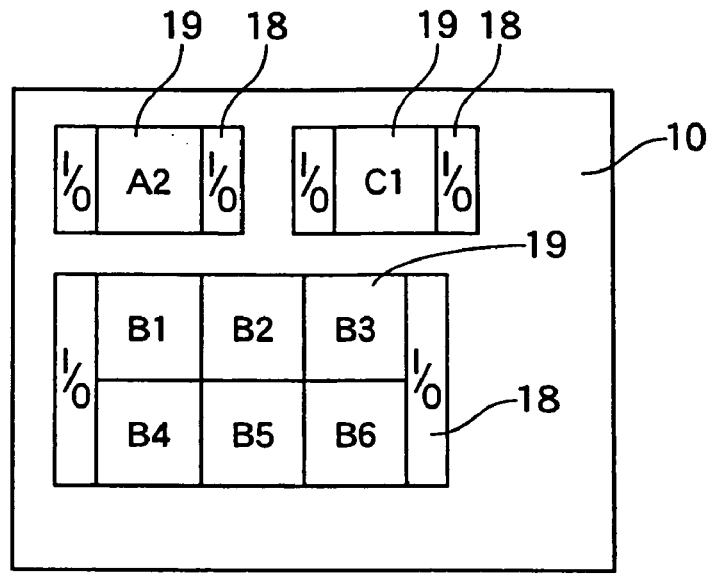
FIG. 8 shows one example of an RC region.
Figure 9:
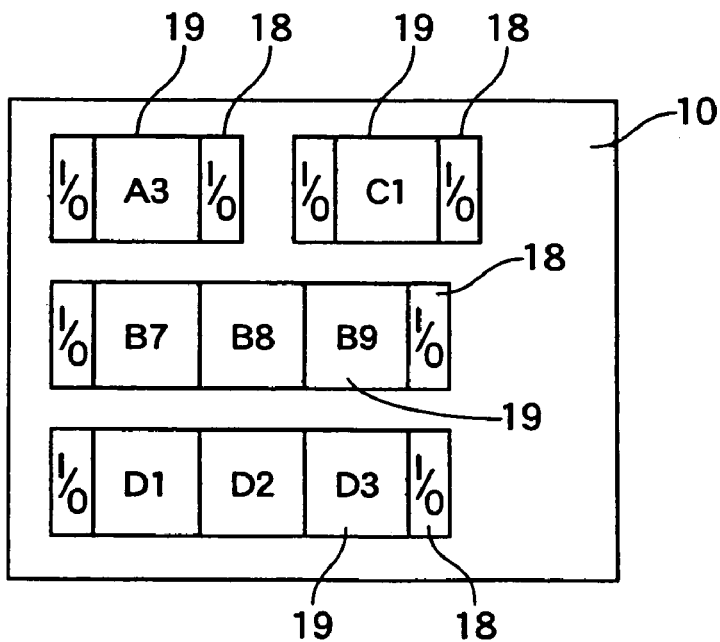
FIG. 9 shows a different example of an RC region.

FIGS. 8 and 9 show the state of the RC region 10 as time passes. The function A is performed by the instant circuits so as to the divided circuits 19 numbered A1, A2, and A3 are consecutively generated and deleted, with the transferring of data between the divided circuits 19 being carried out by the RTM 12. The function B is recognized in the RTM 12 in the illustrated sequence as a function requiring urgency, and is generated using a large amount of hardware resources of the RC region 10. At the timing shown in FIG. 8, the function D is deleted and the resources used thereby are used to generate a number of divided circuits 19. At the timing shown in FIG. 9, the divided circuits 19 of the function D are remapped on the region where the divided circuits 19 for the function B have been deleted, and the processing of the function D is re-executed from the beginning or from a midpoint.

Figure 10:
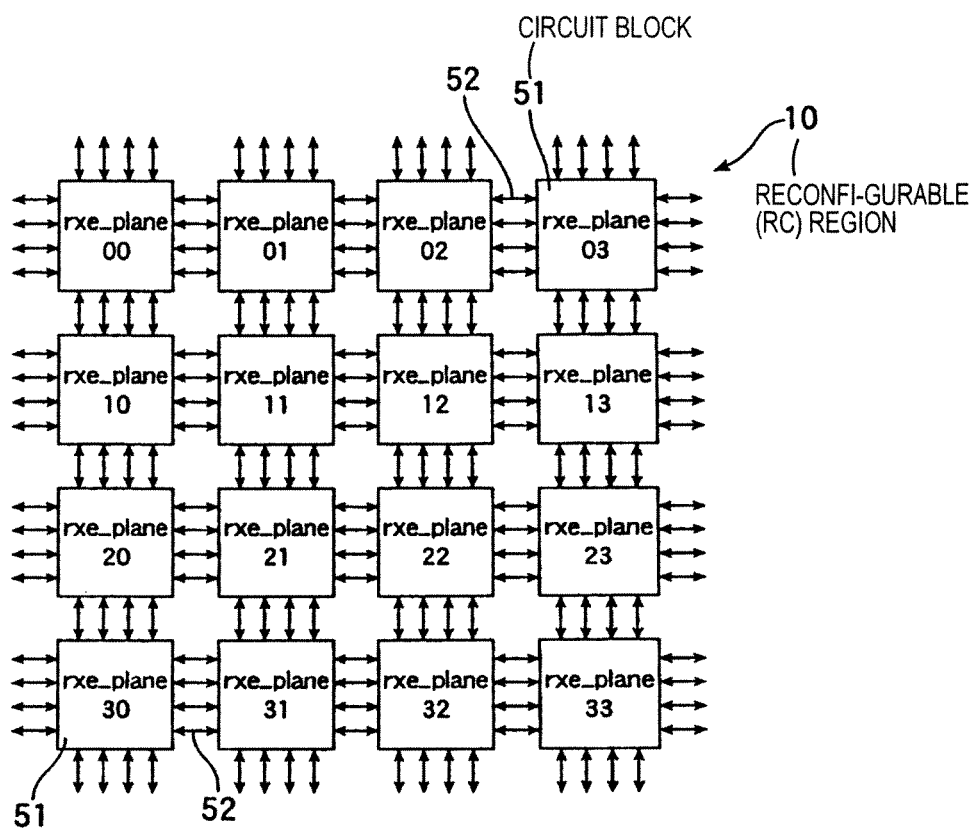
FIG. 10 shows the hardware configuration of an RC region.

FIG. 10 shows the configuration of the RC region 10. In the RC region 10 of the present embodiment, circuit blocks (rxe_plane) 51 that are groups or assemblies of a plurality of elements whose individual logic operations can be changed are arranged in a lattice (an array or a matrix) and are interconnected by wires 52. The size of the divided circuits 19 defined by the architecture codes 20 should preferably be a multiple of units of the circuit blocks 51. Using such divided circuit information 24 as the context (configuration information), the divided circuits 19 are mapped so as to consume one or a plurality of circuit blocks 51.

Figure 11:
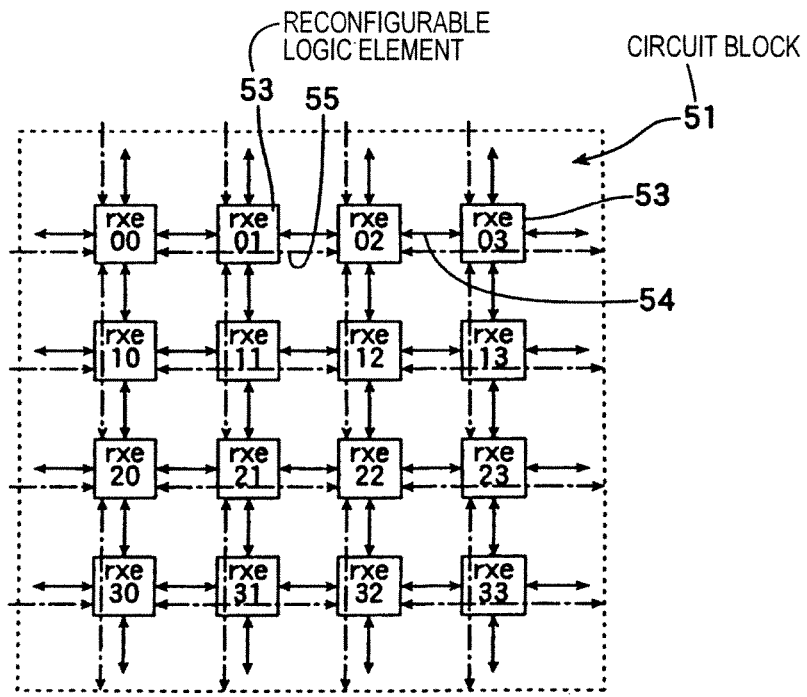
FIG. 11 shows the arrangement of elements.

FIG. 11 shows the configuration of one circuit block 51. In the present embodiment, sixteen logic elements 53 are disposed in each circuit block 51 to construct a four by four array. The respective logic elements 53 are connected to the adjacent logic elements 53 above, below, on the left, and on the right in FIG. 11 by four-bit buses 54 of "layer 1". The buses 55 of "layer 2" that pass the adjacent logic elements 53 above, below, on the left, and on the right to connect logic elements 53 located further out are also provided. By the buses, the logic elements 53 can be connected more flexibly. Buses of "Layer 3" for connecting between logic elements 53 three positions left may also be provided.

The respective logic elements 53 include a function as a logic operation element and a function as a wiring switch that switches the connections between logic elements. Since it is necessary to change or exchange the logic to be used and the state of the wire connections at high speed, elements called RXE (Rapid eXchange Elements) 53 capable of high-speed exchanging operations are disposed in the RC region 10 according to the present embodiment.

Figure 12:
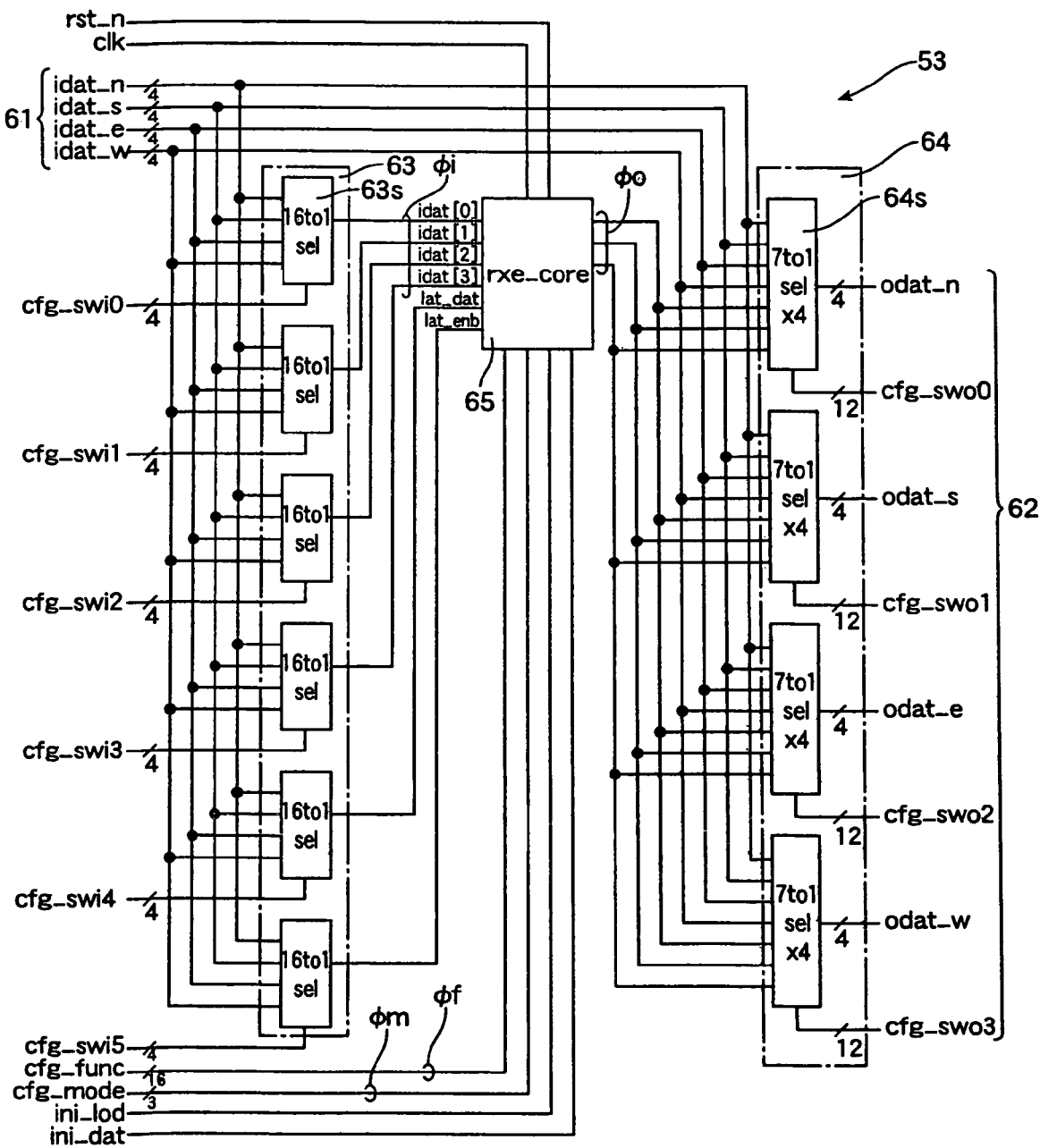
FIG. 12 shows the configuration of an element.

FIG. 12 shows the configuration of an RXE 53. The RXE 53 includes four input routes (circuits) 61, four output routes (circuits) 62, an input interface 63 that freely selects input data from the four input routes 61, an operation core 65 that carries out a logic operation on the input data (φi selected by the input interface 63 and outputs data, and an output interface 64 that freely selects output from the four input routes 61 and output data φo of the operation core 65 and can connect the selected output to the four output routes 62. The operation core 65 has a configuration so that the logic operation can be changed and functions as an operation element whose logic can be changed or reconfigured. The input interface 63 has a configuration including an arrangement of a plurality of 16-to-1 selectors 63s that freely select one bit from the four input routes 61 respectively. The output interface 64 has a configuration including an arrangement of a plurality of 7-to-1 selectors 64s that route the output φo from the operation core 65 and the four inputs 61 respectively.

Figure 13:
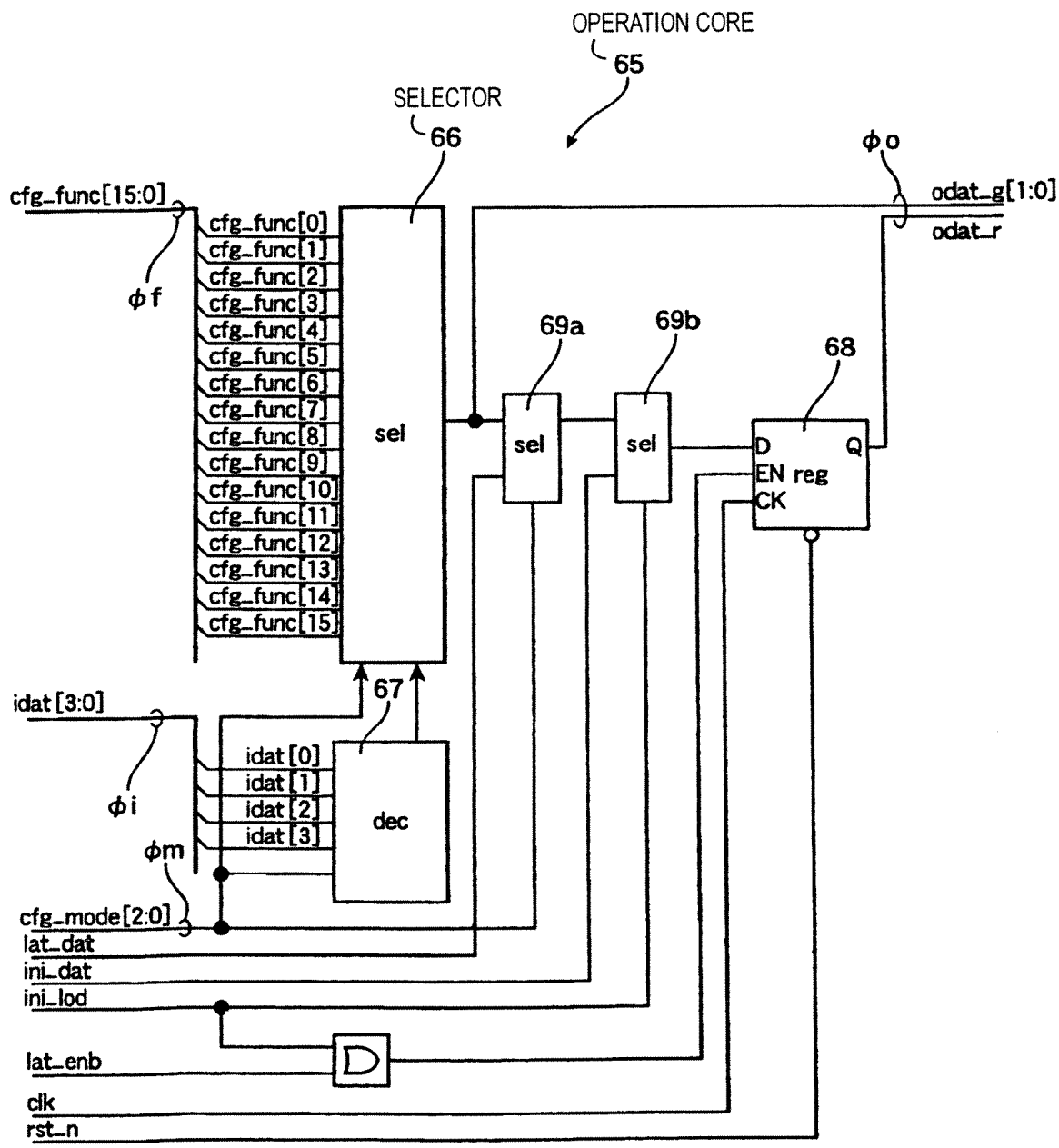
FIG. 13 shows the configuration of an operation core.

FIG. 13 shows the configuration of the operation core (rxe_core) 65. The operation core 65 includes a selector 66 that has a 16-bit function code φo for designating a logic operation as an input and selects the output data φo according to the input data φi. The operation core 65 further includes a decoder 67 that decodes 4-bit input data φi to generate a selection signal for the 16-bit selector 66, a register 68 that latches the data from one of the four input routes 61 or the output data φo, and selectors 69a and 69b for selecting the signal to be latched in the register 68.

FIGS. 14 and 15 show behaviors of the operation core 65. The operation core 65 changes its operation according to the mode signal φm. In "mode 0" in FIG. 14, the operation core 65 generates 1-bit output data φo from the 4-bit input data φi, latches the output data φo in the register 68, and outputs the output data φo. In "mode 1" in FIG. 14, the operation core 65 generates 1-bit output data φo from the 4-bit input data φi and outputs the output data φo without latching the output data φo in the register 68. The output data φo depends on the result of decoding the 16-bit function code φf and the input data φi. Accordingly, as shown in FIG. 16, in these modes, by changing the function code φf, it is possible to use the operation core 65 as nine or more types of logic operation element from a four-input AND to a four-input comparator.

In addition, the operation core 65 carries out a logic operation using a combination of the selector 66 and the function code φf. This means that unlike a conventional FPGA, it is not necessary to set logic in a lookup table (LUT) using a memory element such as an SRAM. Accordingly, it is possible to omit cycles that carry out input/output for the SRAM, and it is possible to instantly switch the operation carried out by the operation core 65 at the timing when the function code φf is outputted to the operation core 65. For this reason, the operation core 65 in the present embodiment is referred to as a "rapid exchange element".

In "mode 2" to "mode 4" shown in FIG. 15, a single operation core 65 functions as two operation elements that respectively output 1-bit output data φo for 2-bit input signals φi. That is, the included 16-to-1 selector 66 is set so as to operate as two 4-to-1 selectors. In "mode 2" to "mode 4", as shown in FIG. 16, by changing the function code φf, the operation core 65 can be used as seven or more types of logic operation element from an inverter to a two-input EXNOR.

In addition, in "mode 5" to "mode 7" shown in FIG. 15, the operation core 65 can be used as an operation element that outputs 1-bit output data φo for a 3-bit input signal φi. If the input of an additional bit is permitted, the included 16-to-1 selector 66 can be set so as to operate as two 3-to-1 selectors, and therefore the operation core 65 can be used as two 3-bit input/1-bit output operation elements. In "mode 5" to "mode 7", as shown in FIG. 16, by changing the function code φf, the operation core 65 can be used as five or more types of logic operation element from a three-input AND to a full adder.

In this way, the logic of the RXEs 53 that construct the RC region 10 of the present embodiment can be exchanged at high-speed using selectors. In addition, the RXEs 53 internally include the registers 68 that latch the output data and therefore, the RXEs 53 can output directly and/or via a flip-flop in a state where the output data is synchronized with a clock. Accordingly, combinational circuits (decoders), and sequential circuits (state machines) and operation circuits (data paths), all of them are often used in digital circuits, can be efficiently implemented and executed by the circuit information of the architecture codes 20.

The elements (RXE) 53 of the present embodiment whose logic can be reconfigured are for arranging a two-dimensional array or matrix. Accordingly, four circuits for input and output respectively are suited to being disposed in a two-dimensional array. However, if the network that connects the elements is one-dimensional, two or three inputs and outputs may be enough. In addition, if the network that connects the elements is three dimensional, five or more inputs and outputs should preferably be used. In addition, although the operation core (rxe_core) of the present embodiment uses selectors to make it possible to carry out exchanging operations at high speed, if it is possible to consume a cycle by inputting logic into a lookup table (LUT), it is possible to use an operation core including an LUT.

In addition, although a matrix includes elements 53 of the same configuration in the present embodiment, it is also possible to arrange a matrix from elements for logic operations and elements that form a network. Also, by using a matrix in which a plurality of types of elements, such as elements with fairly specialized functions, such as elements mostly for arithmetic calculations, elements mainly for generating addresses, and general-purpose elements but have a certain performance for some processing functions, are arranged with a suitable density, it is possible to construct an RC region with a reconfigurable circuit.

INDUSTRIAL APPLICABILITY

The hardware architecture of a system is often determined by the required specification at a stage of design start or study stage. To cope with changes in requirements at a stage where the actual application is fixed and with changes to the required specification that were not foreseen at the initial design stage, modern FPGAs and PLDs use an architecture where the hardware configuration can be changed. However, such flexibility has disadvantages in that the basic elements that construct the interior become redundant, resulting in a loss in competitiveness in terms of chip cost and in that the operation frequency is low compared to a specially designed LSI or ASSP.

In recent years, attention has been placed on dynamic reconfigurable machines and it is becoming possible to overcome the problem of high chip cost and the disadvantage of low operation frequency. However, such competitiveness is still insufficient compared to dedicated LSIs that are developed over one or two years. In the present invention, in addition to solving the above problems, by achieving low power consumption, it is possible to achieve an overall cost performance of present SoCs (System-on-Chip), and by dynamically optimizing the architecture, a next-generation "hyper SoC" can be realized.

The problems for current LSI development are, although competitiveness based on chip cost is low and performance and power consumption are excellent, that excessive development time and development cost are required. Such problems can also be solved with the present invention.

The normal approach for present LSI design uses hardware description language (Verilog-HDL or VHDL) and translates (logically synthesizing) such hardware description language to a netlist using the libraries and according to the connecting types suited to the processing carried out in semiconductor of various companies. In such design, the operation frequency is affected by the connected state of the physical wiring and logic gates (circuits), but a larger problem is that it is not possible to optimize from the viewpoint of the system architecture. That is, present SoC, FPGA, and dynamic reconfigurable technology, are constructed so that dynamic optimization from the architecture level is not possible when executing hardware. The present invention makes it possible to dynamically optimize a hardware space when executing hardware and therefore solves the above problem.

Also, with present methods of developing and implementing LSIs, an extremely high cost is required to raise system reliability and ensure quality. One reason for this is that an internal function check can only be carried out if a test circuit can be implemented. When a test circuit is implemented, chip area becomes occupied by the test circuit, which raises the chip cost. Accordingly, although there are means for ultimately raising quality, there is a tradeoff with cost, and therefore there are limits for ensuring reliability and quality. This results in testing that is essential for consumer products itself making such products less competitive. In addition, designing so as to simplify debugging is also a necessary concept to reduce the overall development time and development resources, but the design cost required to do so can also increase the chip cost.

The present invention can provide a solution to all of the above problems. The dynamic optimization technology for a hardware space according to the present invention creates circuits for ensuring reliability and quality only when such circuits are required and therefore can minimize the effect on total cost. Circuits for simplifying debugging are usually no longer required after debugging is completed. Conversely, it is sufficient to generate circuits for debugging at the necessary timing for such circuits, which can be achieved extremely easily with the present invention.

In addition, the present invention that is based on architecture codes makes it possible in the future to dynamically change and generate test circuits and circuits that realize other functions using a network or the like, and therefore the cost of constructing a large-scale, complex system can be greatly reduced. Accordingly, by using a local terminal including the data processing apparatus according to the present invention realized on a small chip and connecting a virtual hardware space with a large amount of resources via a network, it is possible to realize a great variety of functions with a small local terminal. This system has a completely opposite concept to current methods where processing is carried out using hardware resources present on a network by communicating a large amount of input/output data via the network, and this system aims to realize the hardware resources present on the network on the local terminal. Accordingly, by the present invention, it is possible to provide a system with a number of advantages, such as a reduction in the transmission and reception of a large amount of input/output data and therefore a reduced load on a network, and the ability to protect the secrecy of data.

Also, although an example where the present invention is applied to an LSI based on semiconductor integrated circuit technology has been described above, the present invention can be applied to all kinds of data processing systems or apparatuses that form circuit networks. That is, applicability of the present invention is not limited to data processing apparatuses based on circuit technology at the electrical or electronic level and the present invention can be applied to all data processing systems that form networks based on optical, biological, molecular and atomic, or genetic structures.

The invention claimed is:

1. A control method for controlling a data processing system including a logic circuit region where circuits are dynamically reconfigurable, the control method comprising:
   obtaining an architecture code, the architecture code including object circuit information for mapping an object circuit that is at least part of a circuit for executing an application onto part of the logic circuit region, interface circuit information for mapping an interface circuit in contact with the object circuit onto the logic circuit region, and boundary condition to be realized in the interface circuit;
   mapping the object circuit and the interface circuit in contact with the object circuit onto the logic circuit region according to the object circuit information and the interface circuit information of the architecture code; and
   activating the interface circuit based on the boundary condition of the architecture code, and
   wherein the object circuit is a divided circuit of a hardware module for implementing a function, and wherein the boundary condition includes information of timing control of data supplying to the object circuit so that the object circuit functions as the divided circuit of the hardware module when the object circuit is mapped spatially and/or temporally divided to other divided circuits.

2. The control method according to claim 1, wherein the mapping includes, when the interface circuit information and the boundary condition match or correspond that of an adjacent object circuit at a boundary, mapping the object circuit connecting with the adjacent object circuit without passing respective interface circuits.

3. The control method according to claim 1, wherein the activating includes reflecting a state of an interface circuit of another object circuit mapped by spatially and/or temporally dividing on the logic circuit region in control of the interface circuit of the object circuit based on the boundary condition.

4. The control method according to claim 1, wherein the obtaining includes selecting the architecture code to be obtained based on information of behavioral environment including a request to the data processing system, an execution state of mapped object circuit, and a usable state of the logic circuit region.

5. The control method according to claim 1, wherein the obtaining includes obtaining the architecture code via a communication network.

6. The control method according to claim 1, wherein the logic circuit region includes a plurality of circuit blocks constructed of a predetermined number of reconfigurable elements and the architecture code includes the object circuit information in units of the circuit blocks.

7. A data processing system comprising:
   a logic circuit region where circuits are dynamically reconfigurable;
   a load unit for obtaining an architecture code, the architecture code including object circuit information for mapping an object circuit that is at least part of a circuit for executing an application onto part of the logic circuit region, interface circuit information for mapping an interface circuit in contact with the object circuit onto the logic circuit region, and boundary condition to be realized in the interface circuit;
   a mapping unit for mapping the object circuit and the interface circuit in contact with the object circuit onto the logic circuit region according to the object circuit information and the interface circuit information of the architecture code, and
   a behavior control unit for controlling the interface circuit according to the boundary condition of the architecture code, and
   wherein the object circuit is a divided circuit of a hardware module for implementing a function, and wherein the boundary condition includes information of timing control of data supplying to the object circuit so that the object circuit functions as the divided circuit of the hardware module when the object circuit is mapped spatially and/or temporally divided to other divided circuits.

8. The data processing system according to claim 7, wherein the load unit, the mapping unit, and the behavior control unit are hardware modules and are implemented in the logic circuit region as divided circuits.

9. The data processing system according to claim 7, wherein the mapping unit carries out mapping of the object circuit and the interface circuit onto any usable region in the logic circuit region.

10. The data processing system according to claim 7, wherein when the interface circuit information and boundary condition match or correspond that of an adjacent object circuit at a boundary, the mapping unit carries out mapping of the object circuit connecting with the adjacent object circuit without passing respective interface circuits.

11. The data processing system according to claim 7, wherein the behavior control unit reflects a state of an interface circuit of another object circuit mapped by spatially and/or temporally dividing on the logic circuit region in control of the interface circuit of the object circuit based on the boundary condition.

12. The data processing system according to claim 7, further comprising a boundary information memory for storing a state of an interface circuit of an object circuit mapped by spatially and/or temporally dividing on the logic circuit region.

13. The data processing system according to claim 7, wherein the load unit obtains the architecture code from an architecture library including a plurality of architecture codes, based on information of behavioral environment including a request to the data processing system, an execution state of mapped object circuit, and a usable state of the logic circuit region.

14. The data processing system according to claim 7, wherein the load unit obtains the architecture code via a communication network.

15. The data processing system according to claim 7, further comprising an architecture library including a plurality of architecture codes for configuring a plurality of hardware modules.

16. The data processing system according to claim 7, wherein the logic circuit region includes a plurality of circuit blocks constructed of a predetermined number of reconfigurable elements and the architecture code includes the object circuit information in units of the circuit blocks.

17. The data processing system according to claim 16, wherein the elements respectively include:
   n inputs and n outputs, the n being a plural;
   an input interface for freely selecting input data out of the n inputs;

an operation core for performing a logic operation on the input data selected by the input interface and outputs output data, wherein the logic operation is changeable;

an output interface for freely selecting output from at least one of the n inputs and the output data and outputs the output via at least one out of the n outputs.

18. The data processing system according to claim 17, wherein the operation core includes a selector into which a multibit function code that designates logic operation is inputted and which selects the output data according to the input data.

19. The data processing system according to claim 17, wherein the operation core includes a register for latching one of data of one of the n inputs and the output data.

20. An automated control system comprising:
a data processing system according to claim 7; and
a plurality of automated control mechanisms for which at least one of a plurality of hardware modules to be configured in the data processing system is used in respective control or data processing,
wherein mapping of divided circuits of the plurality of hardware modules are dynamically performed in the logic circuit region.

21. The automated control system according to claim 20, further including a communication mechanism for obtaining the architecture code by communication with outside.

22. A terminal comprising:
a data processing system according to claim 7; and
a communication mechanism for obtaining the architecture code by communication with outside.

23. A computer program product comprising a recording medium on which architecture code for controlling a data processing system including a logic circuit region where circuits are dynamically reconfigurable is recorded, the architecture code including object circuit information for mapping an object circuit that is at least part of a circuit for executing an application onto part of the logic circuit region, interface circuit information for mapping an interface circuit in contact with the object circuit onto the logic circuit region, and boundary condition to be realized in the interface circuit, and
wherein the object circuit is a divided circuit of a hardware module for implementing a function, and wherein the boundary condition includes information of timing control of data supplying to the object circuit so that the object circuit functions as the divided circuit of the hardware module when the object circuit is mapped spatially and/or temporally divided to other divided circuits.

24. A method for generating an architecture code for controlling a data processing system including a logic circuit region where circuits are dynamically reconfigurable, the architecture code including object circuit information for mapping an object circuit that is at least part of a circuit for executing an application onto part of the logic circuit region, interface circuit information for mapping an interface circuit in contact with the object circuit onto the logic circuit region, and boundary condition to be realized in the interface circuit, the method comprising:
generating object circuit information by dividing a netlist of the circuit for executing the application and resolving place and route issues within divided ranges of the netlist;
generating interface circuit information from information in the netlist for forming boundary of the object circuit configured by the object circuit information; and
converting the netlist into a group of object circuits, resolving place and route issues among the object circuits, and generating boundary condition of interface circuits of respective object circuits, and
wherein the object circuit is a divided circuit of a hardware module for implementing a function, and wherein the boundary condition includes information of timing control of data supplying to the object circuit so that the object circuit functions as the divided circuit of the hardware module when the object circuit is mapped spatially and/or temporally divided to other divided circuits.

* * * * *